United States Patent
Jeong et al.

(10) Patent No.: US 12,080,244 B2
(45) Date of Patent: Sep. 3, 2024

(54) DISPLAY APPARATUS

(71) Applicant: Samsung Display Co., Ltd., Yongin-Si (KR)

(72) Inventors: Junki Jeong, Yongin-si (KR); Seonyoung Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/083,633

(22) Filed: Dec. 19, 2022

(65) Prior Publication Data

US 2023/0119107 A1    Apr. 20, 2023

Related U.S. Application Data

(63) Continuation of application No. 17/337,481, filed on Jun. 3, 2021, now Pat. No. 11,532,276.

(30) Foreign Application Priority Data

Aug. 26, 2020    (KR) ........................ 10-2020-0108047

(51) Int. Cl.
   G09G 3/3266    (2016.01)
   H10K 59/124    (2023.01)
   H10K 59/131    (2023.01)

(52) U.S. Cl.
   CPC ......... *G09G 3/3266* (2013.01); *H10K 59/124* (2023.02); *H10K 59/131* (2023.02); *G09G 2300/0408* (2013.01); *G09G 2310/0291* (2013.01); *G09G 2330/028* (2013.01)

(58) Field of Classification Search
   CPC ... G09G 3/3266; H10K 59/131; H10K 59/124
   See application file for complete search history.

(56) References Cited

U.S. PATENT DOCUMENTS

| | | | |
|---|---|---|---|
| 9,606,405 B2 | 3/2017 | Yang et al. | |
| 10,263,211 B2* | 4/2019 | Byun | H10K 59/1315 |
| 10,553,147 B2 | 2/2020 | Jang et al. | |
| 10,707,281 B2* | 7/2020 | Kuo | G09G 3/3225 |
| 10,713,989 B2* | 7/2020 | Chen | G09G 3/20 |
| 10,769,994 B2 | 9/2020 | Ka et al. | |
| 10,909,930 B2 | 2/2021 | Kim et al. | |
| 10,984,723 B1* | 4/2021 | Zhou | G09G 3/3258 |

(Continued)

FOREIGN PATENT DOCUMENTS

| | | |
|---|---|---|
| CN | 107742502 A | 2/2018 |
| CN | 110047897 A | 7/2019 |

(Continued)

*Primary Examiner* — Sardis F Azongha
(74) *Attorney, Agent, or Firm* — Innovation Counsel LLP

(57) ABSTRACT

A display apparatus including a main display area, a component area, and a peripheral area, the display apparatus includes: a substrate; an auxiliary sub-pixel arranged in the component area on the substrate; an auxiliary pixel circuit arranged in the peripheral area on the substrate; a connection line connecting the auxiliary sub-pixel to the auxiliary pixel circuit; an auxiliary scan line arranged in the peripheral area on the substrate and connected to the auxiliary pixel circuit; and an auxiliary scan driving circuit arranged in the peripheral area on the substrate and configured to output a scan signal to the auxiliary pixel circuit through the auxiliary scan line.

19 Claims, 22 Drawing Sheets

(56) References Cited

U.S. PATENT DOCUMENTS

| | | | |
|---|---|---|---|
| 11,227,538 B2 | 1/2022 | Yang et al. | |
| 2011/0102389 A1 | 5/2011 | Park et al. | |
| 2020/0042759 A1 | 2/2020 | Kim et al. | |
| 2020/0098313 A1 | 3/2020 | Bian | |
| 2020/0312927 A1* | 10/2020 | Bae | H10K 59/126 |
| 2021/0193758 A1* | 6/2021 | Choi | H10K 59/131 |
| 2021/0248945 A1 | 8/2021 | Liu et al. | |

FOREIGN PATENT DOCUMENTS

| | | |
|---|---|---|
| CN | 111048041 A | 4/2020 |
| CN | 111063719 A | 4/2020 |
| KR | 10-2020-0015869 A | 2/2020 |

\* cited by examiner

DISPLAY APPARATUS

CROSS-REFERENCE TO RELATED APPLICATION

This application is a continuation application of U.S. patent application Ser. No. 17/337,481 filed on Jun. 3, 2021, which claims priority under 35 U.S.C. § 119 to Korean Patent Application No. 10-2020-0108047, filed on Aug. 26, 2020, in the Korean Intellectual Property Office, the disclosure of which is incorporated by reference herein in its entirety.

BACKGROUND

1. Field

One or more embodiments relate to a display apparatus, and more particularly, to a display apparatus with an extended display area to display images even in a region where an electronic element is arranged.

2. Description of Related Art

Recently, the usage of display devices has diversified. In addition, as display devices have become thinner and lighter, their range of use has gradually been extended.

As display apparatuses are utilized in various ways, the shapes of display apparatuses may be designed in various ways, and functions that are combined or associated with display devices have increased.

SUMMARY

One or more embodiments include a display apparatus with an extended display area to display images even in a region where a component, which is an electronic element, is arranged. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus including a main display area, a component area, and a peripheral area includes a substrate, a plurality of first pixel circuits arranged in the main display area over the substrate, a plurality of main scan lines arranged in the main display area over the substrate and connected to the plurality of first pixel circuits, a plurality of second pixel circuits arranged in the peripheral area over the substrate, a plurality of auxiliary scan lines arranged in the peripheral area over the substrate and connected to the plurality of second pixel circuits, a first scan driving circuit arranged in the peripheral area over the substrate and configured to output a first scan signal to the plurality of first pixel circuits through the plurality of main scan lines, and a second scan driving circuit arranged in the peripheral area over the substrate and configured to output a second scan signal to the plurality of second pixel circuits through the plurality of auxiliary scan lines, wherein an output interval of the second scan signal is greater than an output interval of the first scan signal.

The second scan driving circuit may include a plurality of second stages and a plurality of dummy stages disposed between adjacent second stages, and each of the plurality of auxiliary scan lines may be connected to a corresponding second stage among the plurality of second stages.

Each of the plurality of auxiliary scan lines may include a first auxiliary scan line connected to the plurality of second pixel circuits, and a second auxiliary scan line connecting the first auxiliary scan line to an output line of the corresponding second stage.

The first auxiliary scan line and the second auxiliary scan line may be formed in one piece.

The first auxiliary scan line and the second auxiliary scan line may be arranged on different layers with an insulating layer interposed therebetween and connected through a contact hole formed in the insulating layer.

Lengths of the second auxiliary scan lines of the plurality of auxiliary scan lines may be different from each other.

At least one of the plurality of auxiliary scan lines may have bent portions, and the second auxiliary scan lines may have a different number of the bent portions from each other.

The display apparatus may further include a power supply line arranged in the peripheral area and including a region that overlaps a portion of the second auxiliary scan lines having the bent portions.

Each of the plurality of second stages and the plurality of dummy stages may include a shift stage and an output buffer.

A size of the output buffers of the plurality of second stages may be proportional to a length of the second auxiliary scan line connected thereto.

The first scan driving circuit may include a plurality of first stages, and each of the plurality of first stages may include a shift stage and an output buffer.

A size of output buffers of the plurality of second stages may be different from a size of the output buffers of the plurality of first stages.

The display apparatus may further include first sub-pixels arranged in the main display area over the substrate and connected to the plurality of first pixel circuits, second sub-pixels arranged in the component area over the substrate, and connection lines connecting the second sub-pixels to the plurality of second pixel circuits.

According to one or more embodiments, a display apparatus including a main display area, a component area, and a peripheral area includes a substrate, an auxiliary sub-pixel arranged in the component area over the substrate, an auxiliary pixel circuit arranged in the peripheral area over the substrate, a connection line connecting the auxiliary sub-pixel to the auxiliary pixel circuit, an auxiliary scan line arranged in the peripheral area over the substrate and connected to the auxiliary pixel circuit, and an auxiliary scan driving circuit arranged in the peripheral area over the substrate and configured to output a scan signal to the auxiliary pixel circuit through the auxiliary scan line, wherein the auxiliary scan driving circuit may include a plurality of stages and a plurality of dummy stages disposed between adjacent stages and the auxiliary scan line may be connected to a corresponding stage among the plurality of stages.

The auxiliary scan line may include a first auxiliary scan line connected to the second pixel circuit and a second auxiliary scan line connecting the first auxiliary scan line to an output line of the corresponding stage.

Each of the plurality of stages and the plurality of dummy stages may include a shift stage and an output buffer, and a size of the output buffers of the plurality of stages may be proportional to a length of the second auxiliary scan line connected thereto.

The second auxiliary scan line may have bent portions.

The display apparatus may further include a power supply line arranged in the peripheral area and including a region that overlaps the second auxiliary scan line.

The first auxiliary scan line and the second auxiliary scan line may be arranged on different layers with an insulating layer interposed therebetween and connected through a contact hole formed in the insulating layer.

The display apparatus may further include a main sub-pixel arranged in the main display area over the substrate, a main pixel circuit arranged in the main display area over the substrate and connected to the main sub-pixel, a main scan line arranged in the main display area over the substrate and connected to the main pixel circuit, and a main scan driving circuit arranged in the peripheral area over the substrate and configured to output a scan signal to the main pixel circuit through the main scan line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
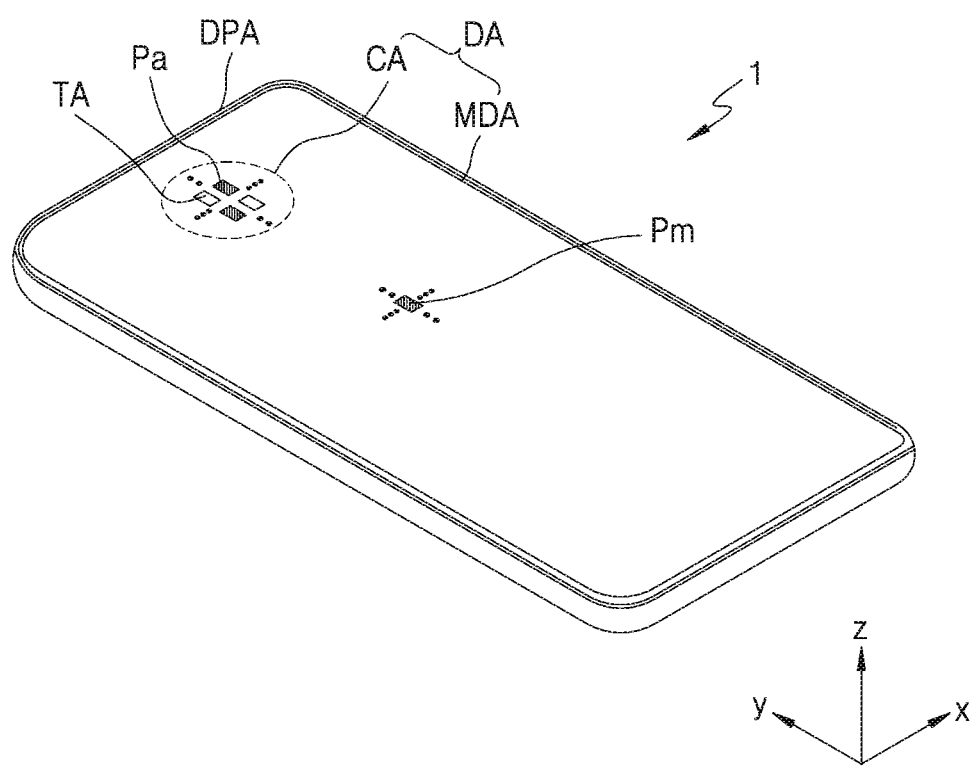
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

It will be further understood that, when a layer, region, or element is referred to as being "on" another layer, region, or element, it can be directly or indirectly on the other layer, region, or element. That is, for example, intervening layers, regions, or elements may be present. Sizes of elements in the drawings may be exaggerated or reduced for convenience of explanation. For example, since sizes and thicknesses of elements in the drawings are arbitrarily illustrated for convenience of explanation, the disclosure is not limited thereto.

As used herein, "on a plan view" means that an objective portion is viewed from above, and "on a cross-sectional view" means that a cross-section of an objective portion taken vertically is viewed from a lateral side. As used herein, when a first element is referred to as "overlapping" a second element, it means that the first element is arranged over or below the second element.

As used herein, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a perspective view of a display apparatus 1 according to an embodiment.

Referring to FIG. 1, the display apparatus 1 includes a display area DA and a peripheral area DPA outside the display area DA. The display area DA includes a component area CA and a main display area MDA at least partially surrounding the component area CA. That is, the component area CA and the main display area MDA may individually display an image or display an image in cooperation with each other. The peripheral area DPA is a kind of non-display area in which display elements are not arranged. The display area DA may be entirely surrounded by the peripheral area DPA.

According to FIG. 1, one component area CA is arranged inside the main display area MDA. In another embodiment, the display apparatus 1 may include two or more component areas CA. The shapes and sizes of the plurality of component areas CA may be different from one another. In a plan view which is a view in a direction approximately perpendicular to the top surface of the display apparatus 1, the component area CA may have various shapes including circular shapes, elliptical shapes, polygons such as quadrangles, star shapes, and diamond shapes. In addition, according to FIG. 1, the component area CA is arranged on the upper central portion of the main display area MDA having an approximately quadrangular shape in a plan view, the component area CA may be arranged on one side, for example, on the upper right or the lower left of the main display area MDA, which is quadrangular.

The display apparatus 1 may display an image by using a plurality of first sub-pixels Pm (or main sub-pixels) arranged in the main display area MDA, and a plurality of second sub-pixels Pa (or auxiliary sub-pixels) arranged in the component area CA.

As described below with reference to FIGS. 2A and 2B, a component 40, which is an electronic element, may be arranged below a display panel to correspond to the component area CA. The component 40 is a camera that uses an infrared or visible ray, etc. and may include an imaging element. Alternatively, the component 40 may include solar batteries, flashes, illuminance sensors, proximity sensors, iris sensors. Alternatively, the component 40 may have a function of sensing sound. To increase functionality of the component 40, the component area CA may include a transmission area TA through which light and/or sound that is output from the component 40 or progressing toward the component 40 from the outside may pass. In a display panel and a display apparatus including the display panel according to an embodiment, when light passes through the component area CA, light transmittance of the component area CA may be 10% or more, 25% or more, 40% or more, 50% or more, 85% or more, or 90% or more.

The plurality of second sub-pixels Pa may be arranged in the component area CA. The plurality of second sub-pixels Pa may display images in response to data signals. An image displayed in the component area CA is an auxiliary image and has a lower resolution than that of an image displayed in the main display area MDA. Because the component area CA includes the transmission area TA through which light and sound may pass, the number of pixels in a unit area in the component area CA may be less than those in the main display area MDA. In the case where the sub-pixels are not arranged in the transmission area TA, the number of second sub-pixels per unit area in the component area CA may be less than the number of first sub-pixels per unit area in the main display area MDA.

Figure 2A:
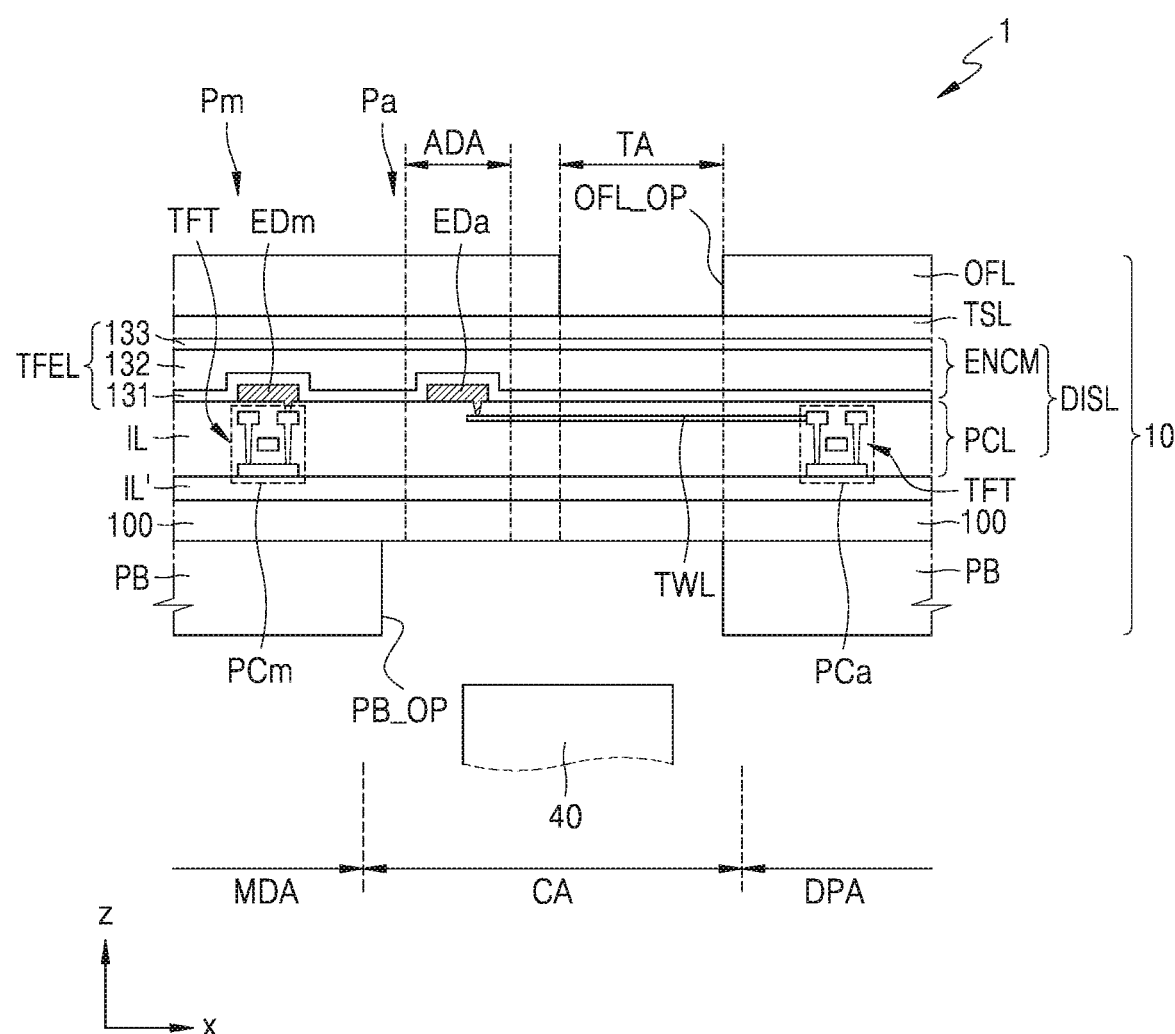
FIGS. 2A and 2B are cross-sectional views of a portion of a display apparatus according to an embodiment.
Figure 2B:
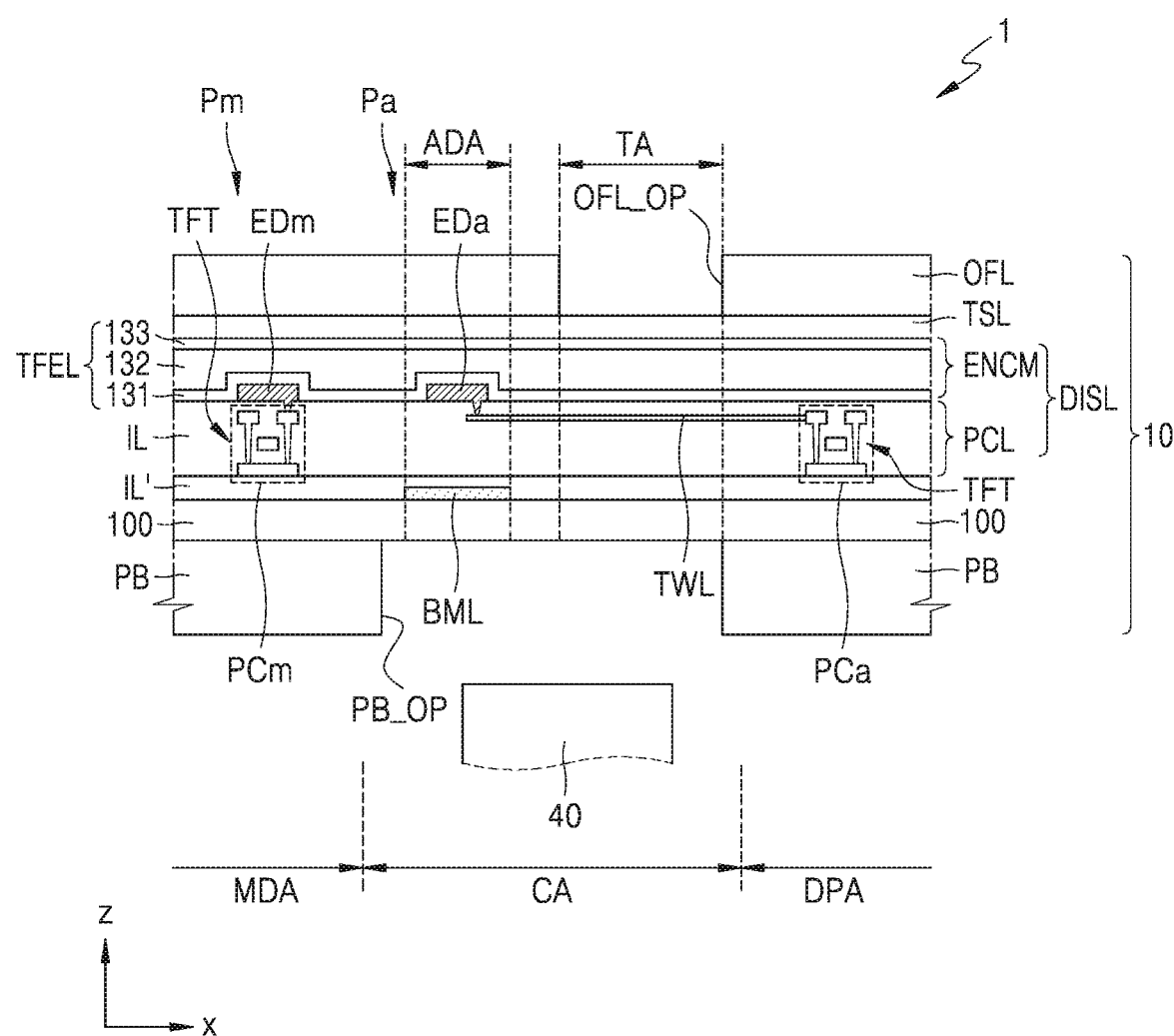

FIGS. 2A and 2B are cross-sectional views of a portion of the display apparatus 1 according to an embodiment.

Referring to FIG. 2A, the display apparatus 1 may include a display panel 10 and the component 40 overlapping the display panel 10. A cover window (not shown) that protects the display panel 10 may be further arranged on the display panel 10.

The display panel 10 includes the component area CA and the main display area MDA. The component area CA is a region that overlaps the component 40 in a plan view. An image may be displayed in the main display area MDA and the component area CA. The display panel 10 may include a substrate 100, a display layer DISL disposed over the substrate 100, a touchscreen layer TSL, an optical functional layer OFL, and a panel-protecting layer PB. The touchscreen layer TSL and the optical functional layer OFL may be disposed on the display layer DISL. The panel-protecting layer PB may be disposed under the substrate 100.

The display layer DISL may include a circuit layer PCL, light-emitting elements EDm and EDa, and an encapsulation layer ENCM. The circuit layer PCL may include a thin-film transistor TFT. The light-emitting elements EDm and EDa may be display elements. The encapsulation layer ENCM may include a thin-film encapsulation layer TFEL or an encapsulation substrate (not shown). Insulating layers IL and IL' may be arranged between the substrate 100 and the display layer DISL in the display layer DISL.

A first pixel circuit PCm (or a main pixel circuit) and a first light-emitting element EDm connected thereto may be arranged in the main display area MDA of the display panel 10. The first pixel circuit PCm may include at least one thin-film transistor TFT and control light-emission of the first light-emitting element EDm. The image displayed by the first sub-pixel Pm may be implemented by light-emission of the first light-emitting element EDm.

A second light-emitting element EDa is arranged in the component area CA of the display panel 10. The image displayed by the second sub-pixel Pa may be implemented by light-emission of the second light-emitting element EDa. In the present embodiment, a second pixel circuit PCa (or an auxiliary pixel circuit) that drives the second light-emitting element EDa is not arranged in the component area CA and may be arranged in the peripheral area DPA which is a non-display area. In another embodiment, the second pixel circuit PCa may be arranged in a portion of the main display area MDA or between the main display area MDA and the component area CA. The location of the second pixel circuit PCa (or an auxiliary pixel circuit) is not limited to an area described above and may be formed in any area which does not overlap the second light-emitting element EDa in a plan view.

The second pixel circuit PCa may include at least one thin-film transistor TFT and be electrically connected to the second light-emitting element EDa through a connection line TWL. The second pixel circuit PCa may control light-emission of the second light-emitting element EDa. A region of the component area CA in which the second light-emitting element EDa is arranged may be referred to as an auxiliary display area ADA.

In addition, a region of the component area CA in which the second light-emitting element EDa, which is a display element, is not arranged may be referred to as the transmission area TA. The transmission area TA may be a region through which light/signal emitted from the component 40 arranged in the component area CA or light/signal incident to the component 40 passes. Auxiliary display areas ADA and transmission areas TA may be alternately arranged in the component area CA along the x-direction and the y-direction. The connection line TWL connecting the second pixel circuit PCa to the second light-emitting element EDa may be arranged in the transmission area TA. The connection line TWL may include a transparent conductive material having a high transmittance, and thus, even when the connection line TWL is arranged in the transmission area TA, the transmittance of the transmission area TA may be secured.

In the present embodiment, since the second pixel circuit PCa is not arranged in the component area CA, the area of the transmission area TA may be secured, and thus, light transmittance may be more improved.

The circuit layer PCL and the display element may be covered by the thin-film encapsulation layer TFEL or the encapsulation substrate. In an embodiment, as shown in FIG. 2, the thin-film encapsulation layer TFEL may include at least one inorganic encapsulation layer and at least one organic encapsulation layer. In an embodiment, the thin-film encapsulation layer TFEL may include first and second inorganic encapsulation layers 131 and 133 and an organic encapsulation layer 132 disposed therebetween.

The first inorganic encapsulation layer 131 and the second inorganic encapsulation layer 133 may include at least one inorganic insulating material including silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The organic encapsulation layer 132 may include a polymer-based material. The polymer-based material may include a silicon-based resin, an acryl-based resin, an epoxy-based resin, polyimide, and polyethylene.

The first inorganic encapsulation layer 131, the organic encapsulation layer 132, and the second inorganic encapsulation layer 133 may be formed as one body to cover the main display area MDA and the component area CA.

In the case where the encapsulation layer ENCM is an encapsulation substrate (not shown), the encapsulation substrate may face the substrate 100 with display elements disposed therebetween. There may be a gap between the encapsulation substrate and the display element. The encapsulation substrate may include glass. Sealant including frit, etc. is arranged between the substrate 100 and the encapsulation substrate. The sealant may be arranged in the peripheral area DPA. The sealant arranged in the peripheral area DPA to surround the display area DA may prevent moisture from penetrating through lateral sides of the display area DA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input by using self-capacitive method or a mutual capacitive method.

The touchscreen layer TSL may be formed on the thin-film encapsulation layer TFEL. Alternatively, the touchscreen layer TSL may be separately formed on a touch substrate and then coupled to the thin-film encapsulation layer TFEL through an adhesive layer such as an optically clear adhesive OCA. In an embodiment, the touchscreen layer TSL may be directly formed on the thin-film encapsulation layer TFEL. In this case, an adhesive layer may not be arranged between the touchscreen layer TSL and thin-film encapsulation layer TFEL.

The optical functional layer OFL may include an anti-reflection layer. The anti-reflection layer may reduce the reflectivity of light (external light) incident onto the display apparatus 1 from the outside.

In an embodiment, the optical functional layer OFL may be a polarizing film. The optical functional layer OFL may include an opening OFL_OP corresponding to the transmission area TA. Accordingly, light transmittance of the transmission area TA may be remarkably improved. The opening OFL_OP may be filled with a transparent material such as an optically clear resin (OCR).

In an embodiment, the optical functional layer OFL may include a filter plate including a black matrix and color filters.

In an embodiment, the optical functional layer OFL may further include a multi-layered structure disposed on the anti-reflection layer. The multi-layered structure may include a first layer and a second layer disposed on the first layer. The first layer and the second layer may include an organic insulating material and have different refractive indexes. As an example, a refractive index of the second layer may be greater than a refractive index of the first layer.

The cover window (not shown) may be arranged on the display panel 10 to protect the display panel 10. The optical functional layer OFL may be attached to the cover window by using an optical clear adhesive or attached to the touchscreen layer TSL by using an optically clear adhesive.

The panel-protecting layer PB may be attached under the substrate 100 to support and protect the substrate 100. The panel-protecting layer PB may include an opening PB_OP corresponding to the component area CA. The panel-protecting layer PB may improve light transmittance of the component area CA by including the opening PB_OP. The panel-protecting layer PB may include polyethylene terephthalate (PET) or polyimide (PI).

The area of the component area CA may be greater than an area in which the component 40 is arranged. Accordingly, the area of the opening PB_OP of the panel-protecting layer PB may not coincide with the area of the component area CA.

In addition, a plurality of components 40 may be arranged in the component area CA. The plurality of components 40 may have different functions. As an example, the plurality of components 40 may include at least two among a camera (an imaging element), a solar battery, a flash, an illuminance sensor, a proximity sensor, and an iris sensor.

As shown in FIG. 2B, the display apparatus 1 according to an embodiment may include a bottom metal layer BML below the second light-emitting element EDa in the component area CA. The bottom metal layer BML may overlap the second light-emitting element EDa in a plan view. The bottom metal layer BML may be disposed between the substrate 100 and the second light-emitting element EDa. The bottom metal layer BML may block external light reaching the second light-emitting element EDa. The bottom metal layer BML may be disposed correspond to the entire component area CA and include a bottom-hole corresponding to the transmission area TA. In this case, the bottom-hole may be provided in various shapes such as a polygonal shape, a circular shape, or an irregular shape to adjust a diffraction characteristic of external light.

Figure 3:
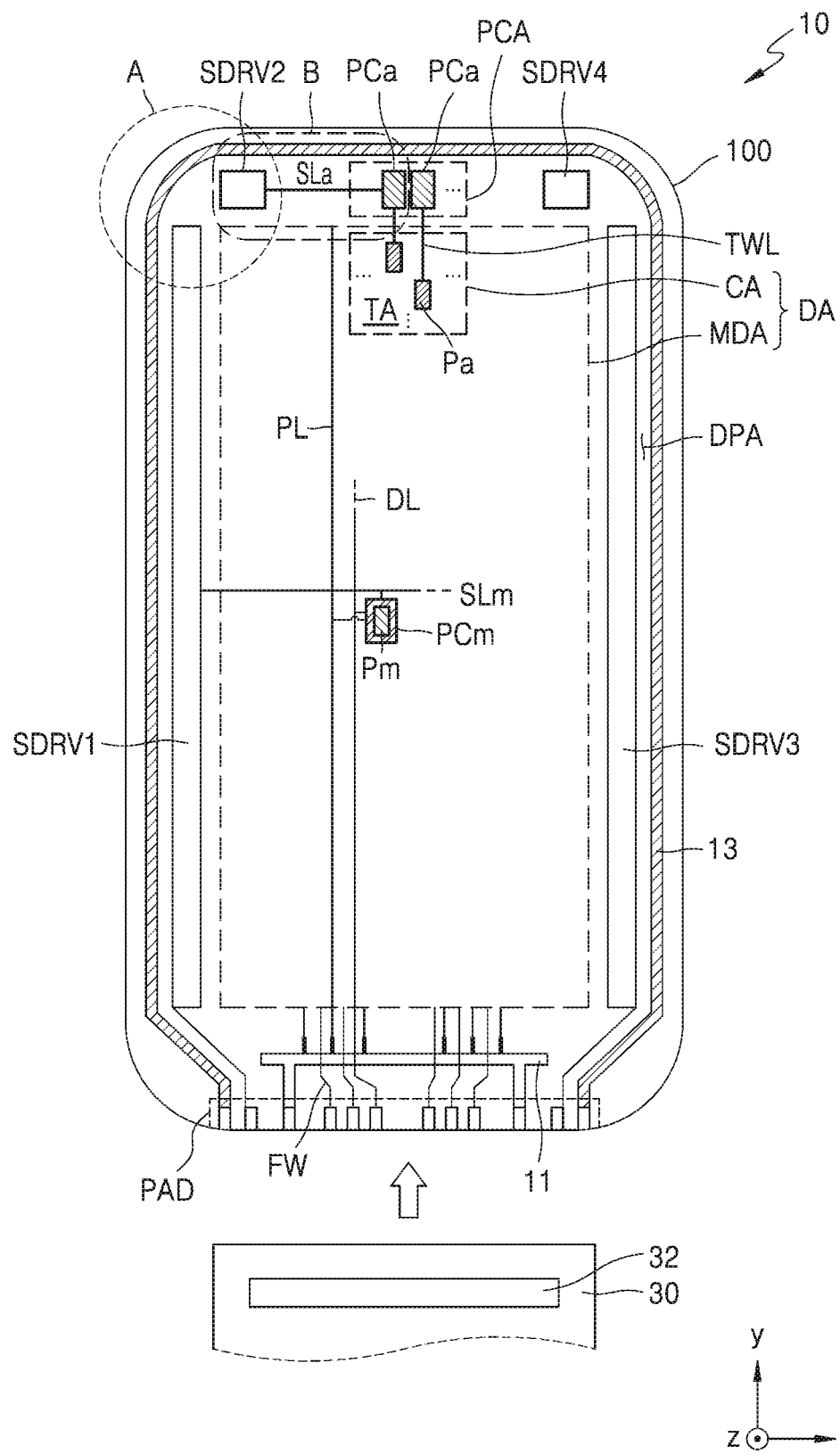
FIG. 3 is a plan view of a display panel that may be included in the display apparatus of FIG. 1.

FIG. 3 is a plan view of the display panel 10 that may be included in the display apparatus of FIG. 1.

Referring to FIG. 3, various kinds of elements constituting the display panel 10 are arranged over the substrate 100. The substrate 100 includes the display area DA and the peripheral area DPA surrounding the display area DA. The display area DA includes the main display area MDA in which a main image is displayed, and the component area CA including the transmission area TA and in which an auxiliary image is displayed. The auxiliary image may form one entire image in cooperation with the main image or may be an image independent of the main image.

A plurality of first sub-pixels Pm are arranged in the main display area MDA. Each of the first sub-pixels Pm may include a display element such as an organic light-emitting diode OLED. The first pixel circuit PCm that drives the first sub-pixel Pm is arranged in the main display area MDA and may overlap the first sub-pixel Pm. Each first sub-pixel Pm may emit, for example, red, green, blue, or white light. The main display area MDA may be covered by an encapsulation layer and thus protected from external air or moisture, etc.

The component area CA may be arranged on one side of the main display area MDA as described above or arranged inside the display area DA and surrounded by the main display area MDA. A plurality of second sub-pixels Pa are arranged in the component area CA. Each of the plurality of second sub-pixels Pa may include a display element such as an organic light-emitting diode. The second pixel circuit PCa that drives the second sub-pixel Pa may be arranged in the peripheral area DPA close to the component area CA. As an example, in the case where the component area CA is arranged on the top of the display area DA, the second pixel circuit PCa may be arranged in the peripheral area DPA. The second pixel circuits PCa may be formed in a designated area in the peripheral area DPA. Hereinafter, a region of the peripheral area DPA in which the second pixel circuits PCa are arranged is referred to as a pixel circuit area PCA. The second pixel circuit PCa and display element that implements the second sub-pixel Pa may be connected to each other by a connection line TWL extending in a y-direction.

Each second sub-pixel Pa may emit, for example, red, green, blue, or white light. The component area CA may be covered by the encapsulation layer and thus protected from external air or moisture, etc.

The component area CA may have the transmission area TA. The transmission area TA may surround the plurality of second sub-pixels Pa. Alternatively, the transmission area TA and the plurality of second sub-pixels Pa may be alternatingly arranged in a lattice configuration along the x-direction and the y-direction.

The component area CA includes the transmission area TA, and thus, a resolution of the component area CA may be lower than a resolution of the main display area MDA. As an example, the resolution of the component area CA may be about ½, ⅜, ⅓, ¼, ⅔, ⅛, ⅑, 1/16 of the resolution of the main display area MDA. As an example, the resolution of the main display area MDA may be 400 ppi or more, and the resolution of the component area CA may be about 200 ppi or about 100 ppi.

Each of pixel circuits that drive the first sub-pixel Pm and the second sub-pixel Pa may be electrically connected to outer circuits arranged in the peripheral area DPA. First to fourth scan driving circuits SDRV1 to SDRV4, a terminal portion PAD, a driving voltage supply line 11, and a common voltage supply line 13 may be arranged in the peripheral area DPA.

The first scan driving circuit SDRV1 (or a first main scan driving circuit) and the third scan driving circuit SDRV3 (or a second main scan driving circuit) face each other with the main display area MDA disposed therebetween and may be respectively arranged on the left of the peripheral area DPA and the right of the peripheral area DPA. The first scan driving circuit SDRV1 and the third scan driving circuit SDRV3 may apply a first scan signal to the first pixel circuits PCm that drive the first sub-pixels Pm through a main scan line SLm. Some of the first pixel circuits PCm corresponding to the first sub-pixels Pm in the main display area MDA may be electrically connected to the first scan driving circuit SDRV1, and the rest of the first pixel circuits PCm may be electrically connected to the third scan driving circuit SDRV3.

A second scan driving circuit SDRV2 (or a first auxiliary scan driving circuit) and a fourth scan driving circuit SDRV4 (or a second auxiliary scan driving circuit) face each other with a pixel circuit area PCA disposed therebetween and may be respectively arranged on the left and right of the peripheral area DPA in the upper portion of the substrate 100. The second scan driving circuit SDRV2 and the fourth scan driving circuit SDRV4 may apply a second scan signal to each of the second pixel circuits PCa that drive the second sub-pixels Pa in the component area CA through an auxiliary scan line SLa. Some of the second pixel circuits PCa corresponding to the second sub-pixels Pa may be electrically connected to the second scan driving circuit SDRV2, and the rest of the second pixel circuits PCa may be electrically connected to the fourth scan driving circuit SDRV4.

In the case of driving the second pixel circuit PCa through a scan driving circuit that drives the first pixel circuit PCm by using an auxiliary scan line that branches from a main scan line, a difference in loads between scan lines connected to the first pixel circuit PCm and the second pixel circuit PCa, respectively, may occur, and thus, a difference in brightnesses between the first sub-pixel Pm and the second sub-pixel Pa may occur. In contrast, in an embodiment, a scan driving circuit that drives the first pixel circuit PCm and a scan driving circuit that drives the second pixel circuit PCa are configured independently, and a main scan line SLm and an auxiliary scan line SLa are configured independently, and thus, the first pixel circuit PCm and the second pixel circuit PCa may be driven independently. Accordingly, an image quality deviation between the main display area MDA and the component area CA may be reduced by reducing a load deviation of a scan signal.

The terminal portion PAD may be arranged on one side of the substrate 100. The terminal portion PAD is not covered by an insulating layer and is exposed and connected to a display circuit board 30. A display driver 32 may be arranged on the display circuit board 30.

The display circuit board 30 may generate a control signal that is transferred to the first to fourth scan driving circuits SDRV1 to SDRV4. The display driver 32 generates a data signal. The generated data signal may be transferred to the main pixel circuits PCm through a fan-out wiring FW and a main data line DLm connected to the fan-out wiring FW.

The display driver 32 may supply a driving voltage ELVDD to the driving voltage supply line 11 and supply a common voltage ELVSS to the common voltage supply line 13. The driving voltage ELVDD may be applied to the first and second pixel circuits PCm and PCa corresponding to the first and second sub-pixels Pm and Pa through a driving voltage line PL connected to the driving voltage supply line 11. The common voltage ELVSS may be applied to an opposite electrode of a display element through the common voltage supply line 13.

The driving voltage supply line 11 may extend in an x-direction in the bottom portion of the main display area MDA. The common voltage supply line 13 may have a loop shape having one open side to partially surround the main display area MDA.

Though FIG. 3 shows the case where there is one component area CA, the component area CA may be provided in plural. In this case, the plurality of component areas CA are spaced apart from each other. A first camera may be arranged to correspond to one component area CA, and a second camera may be arranged to correspond to another component area CA. Alternatively, a camera may be arranged to correspond to one component area CA, and an infrared sensor may be arranged to correspond to another component area CA. The shapes and sizes of the plurality of component areas CA may be different from each other.

The component area CA may have a circular shape, an elliptical shape, a polygonal shape, or an irregular shape. In an embodiment, the component area CA may have an octagonal shape. The component area CA may have various shapes of polygons such as quadrangles and hexagons. The component area CA may be surrounded by the main display area MDA.

Figure 4:
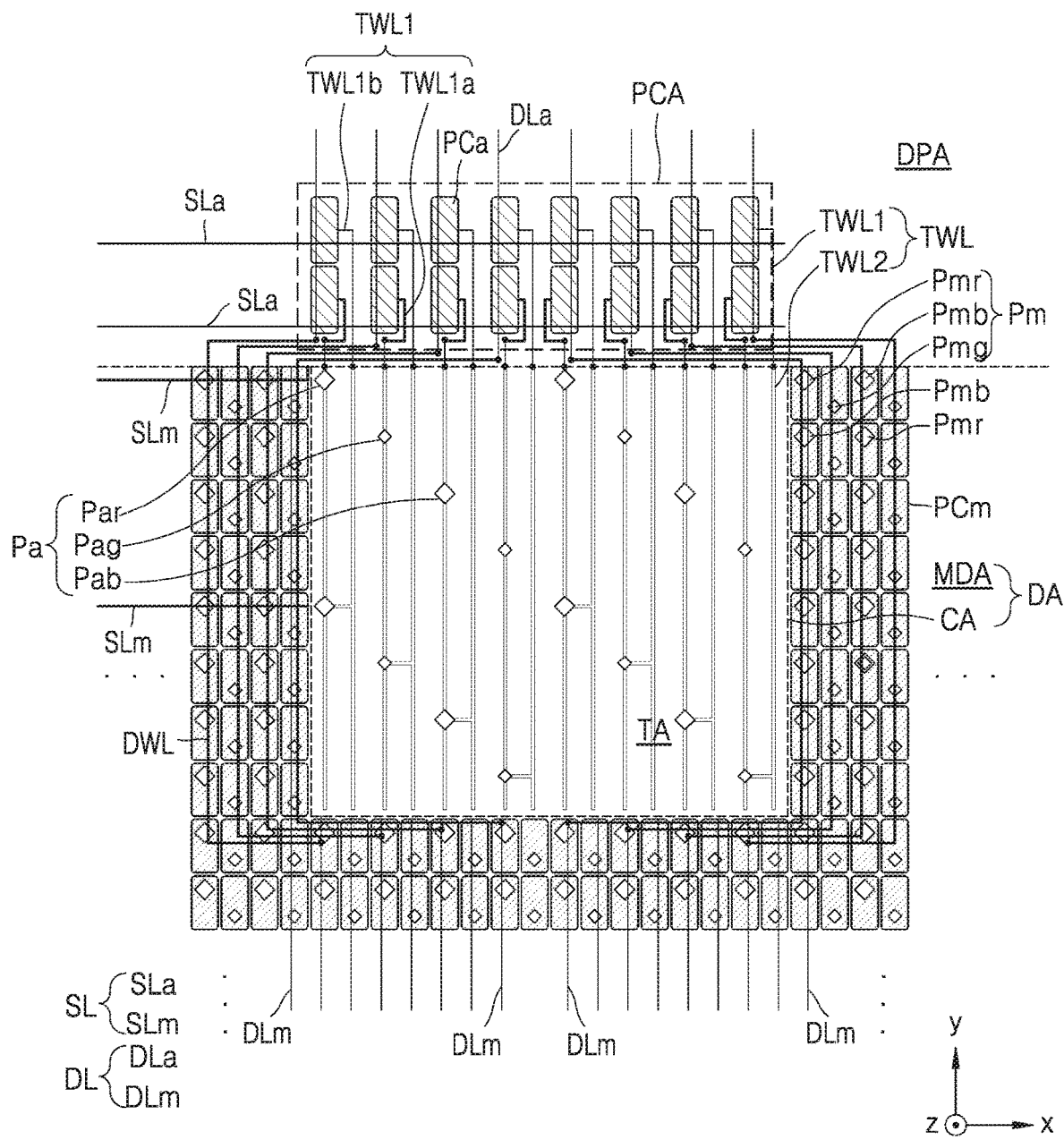
FIG. 4 is a plan view of a portion of a region of a display panel according to an embodiment.

FIG. 4 is a plan view of a portion of a region of the display panel 10 according to an embodiment. In an embodiment, FIG. 4 shows the component area CA, the main display area MDA disposed to surround the component area CA, and a portion of the peripheral area DPA.

Referring to FIG. 4, a plurality of first sub-pixels Pm may be arranged in the main display area MDA. In the present specification, a sub-pixel is a minimum unit that display a primary color and includes an emission area that emits light. In the case where an organic light-emitting diode is employed as a display element, the emission area may be defined by an opening of a pixel-defining layer which is described below. Each of the plurality of first sub-pixels Pm may emit red, green, blue, or white light.

In an embodiment, the first sub-pixel Pm arranged in the main display area MDA may include a first-color sub-pixel Pmr, a second-color sub-pixel Pmg, and a third-color sub-pixel Pmb. The first-color sub-pixel Pmr, the second-color sub-pixel Pmg, and the third-color sub-pixel Pmb may respectively emit red light, green light, and blue light. The first sub-pixels Pm may be arranged in a pentile configuration.

As an example, first-color sub-pixels Pmr are respectively arranged on first and third vertexes among the vertexes of a virtual quadrangle with a second-color sub-pixel Pmg disposed at a center of the quadrangle, and third-color sub-pixels Pmb are respectively arranged on second and fourth vertexes which are the rest of the vertexes. The size of the second-color sub-pixel Pmg may be less than the sizes of the first-color sub-pixel Pmr and the third-color sub-pixel Pmb.

This pixel arrangement structure is referred to as a PenTile matrix structure or a PenTile structure. By applying rendering, in which a color of a pixel is represented by sharing the colors of its adjacent pixels, a high resolution may be obtained via a small number of pixels.

Though the plurality of first sub-pixels Pm are arranged in a PenTile matrix structure in the embodiment disclosed in FIG. 4, the embodiment is not limited thereto. As an example, a plurality of first sub-pixels Pm may be arranged in various configurations such as a stripe structure, a mosaic arrangement structure, and a delta arrangement structure.

In the main display area MDA, the first pixel circuits PCm may overlap the first sub-pixels Pm in a plan view and be arranged in a matrix configuration in the x-direction and the y-direction. In the present specification, the first pixel circuit PCm denotes a unit of a pixel circuit that drives one first sub-pixel Pm.

The plurality of second sub-pixels Pa may be arranged in the component area CA. Each of the plurality of second sub-pixels Pa may emit red, green, blue, or white light. In an embodiment, the second sub-pixels Pa arranged in the component area CA may include a first-color sub-pixel Par, a second-color sub-pixel Pag, and a third-color sub-pixel Pab. The first-color sub-pixel Par, the second-color sub-pixel Pag, and the third-color sub-pixel Pab may respectively emit red light, green light, and blue light.

The number of second sub-pixels Pa per unit area in the component area CA may be less than the number of first sub-pixels Pm per unit area in the main display area MDA. As an example, the number of second sub-pixels Pa per unit area and the number of first sub-pixels Pm per unit area may be provided at ratios of 1:2, 1:4, 1:8, or 1:9. That is, the resolution of the component area CA may be ½, ¼, ⅛, or ⅑ of the resolution of the main display area MDA. FIG. 4 shows the case where the resolution of the component area CA is ⅛.

The second sub-pixels Pa in the component area CA may be arranged in various shapes. Some of second sub-pixels Pa may form a pixel group and be arranged in various configurations such as a PenTile structure, a stripe structure, a mosaic structure, and a delta arrangement structure inside the pixel group.

Alternatively, as shown in FIG. 4, the second sub-pixels Pa may be dispersed inside the component area CA. That is, a distance between the second sub-pixels Pa may increase in portion to a distance between the first sub-pixels Pm. A region of the component area CA in which the second sub-pixels Pa are not arranged may be the transmission area TA having a high light transmittance.

The second pixel circuits PCa that control light-emission of the second sub-pixels Pa may be arranged in the pixel circuit area PCA disposed in the peripheral area DPA adjacent to the component area CA. The second pixel circuits PCa are not arranged in the component area CA, and thus, the component area CA may secure a wider transmission area TA.

The second pixel circuits PCa may be connected to the second sub-pixels Pa by the connection line TWL. Because an RC delay may vary according to the length of the connection line TWL, the second pixel circuits PCa may be arranged considering the length of the connection line TWL. In an embodiment, the second pixel circuits PCa may be arranged on an extension line connecting the second sub-pixels Pa arranged along the y-direction. In addition, the same number of the second pixel circuits PCa may be arranged along the y-direction as the number of the second sub-pixels Pa arranged along the y-direction. As an example, as shown in FIG. 4, in the case where two second sub-pixels Pa are arranged along the y-direction in the component area CA, two second pixel circuits PCa may be arranged along the y-direction in the peripheral area DPA.

The connection lines TWL may extend in the y-direction and connect the second sub-pixels Pa and the second pixel circuits PCa. When the connection line TWL is connected to the second sub-pixel Pa, it may mean that the connection line TWL is electrically connected to one of the pixel electrodes of the display elements that constitute the second sub-pixel Pa. When the connection line TWL is connected to the second pixel circuit PCa, it may mean that the connection line TWL is electrically connected to at least one of circuit elements, for example, a thin-film transistor constituting the second pixel circuit PCa.

The connection line TWL may include a first connection line TWL1 and a second connection line TWL2. The first connection line TWL1 and the second connection line TWL2 may be arranged on different layers. In the case where the first connection line TWL1 and the second connection line TWL2 are arranged on different layers, they may be connected to each other through a contact hole. The conductivity of the first connection line TWL1 may be higher than the conductivity of the second connection line TWL2. Since the first connection line TWL1 is arranged in the peripheral area DPA and does not need to secure a light transmittance, the first connection line TWL1 may include a material having a lower light transmittance but having a higher conductivity than the second connection line TWL2. Accordingly, a resistance of the connection line TWL may be reduced.

The first connection line TWL1 may be arranged in the peripheral area DPA and connected to the second pixel circuit PCa. The first connection line TWL1 may include a conductive material including molybdenum (Mo), aluminum (Al), copper (Cu), and titanium (Ti) and include a single layer or a multi-layer including the above materials. The first connection line TWL1 may be provided in plural between the second pixel circuits PCa. In an embodiment, the first connection line TWL1 may include a (1-1)st connection line TWL1*a* and a (1-2)nd connection line TWL1*b* arranged on different layers. As an example, the (1-1)st connection line TWL1*a* may be arranged on the same layer as the data line DL and may include the same material as the data line DL. The (1-2)nd connection line TWL1*b* and the (1-1)st connection line TWL1*a* may be arranged with an insulating layer interposed therebetween. The (1-1)st connection line TWL1*a* and the (1-2)nd connection line TWL1*b* may be arranged between the second pixel circuits PCa disposed adjacent to each other along the x-direction and at least partially bent in a plan view. The (1-1)st connection line TWL1a and the (1-2)nd connection line TWL1b arranged on different layers may be provided in plural and alternately arranged in a region between the plurality of second pixel circuits PCa.

The second connection line TWL2 may be arranged in the component area CA and connected to the first connection line TWL1 in the edge of the component area CA. The second connection line TWL2 may include a transparent conductive material. As an example, the second connection line TWL2 may include a transparent conductive oxide (TCO). The second connection line TWL2 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The lengths of the second connection lines TWL2 may be the same. As an example, the ends of the plurality of second connection lines TWL2 may extend to a boundary between the component area CA and the main display area MDA which is disposed on the opposite side in which the second pixel circuits PCa are arranged. This is intended for matching an electric load by the second connection line TWL2. Accordingly, a brightness deviation may be reduced in the component area CA. The number of second connection lines TWL2 of the component area CA may be the same as the number of second pixel circuits PCa.

Though the first connection line TWL1 and the second connection line TWL2 are arranged on different layers in FIG. 4, the first connection line TWL1 and the second connection line TWL2 may be arranged on the same layer, and the first connection line TWL1 and the second connection line TWL2 may be provided as a single piece extending from the peripheral area DPA to the second sub-pixels Pa of the component area CA in another embodiment.

The scan line SL may include the main scan line SLm and the auxiliary scan line SLa, the main scan line SLm being connected to the first pixel circuits PCm, and the auxiliary scan line SLa being connected to the second pixel circuits PCa. The main scan line SLm may extend in the x-direction in the main display area MDA and be connected to the first pixel circuit PCm arranged on the same row. The main scan line SLm may not be arranged in the component area CA. That is, the main scan line SLm may be disconnected in the component area CA. In this case, the main scan line SLm on the left of the component area CA may receive a scan signal from the first scan driving circuit SDRV1 (see FIG. 3), and the main scan line SLm on the right of the component area CA may receive a scan signal from the third scan driving circuit SDRV3 (see FIG. 3). The auxiliary scan line SLa may extend in the x-direction in the peripheral area DPA and be connected to the second pixel circuit PCa arranged in the same row.

The data line DL may include the main data lines DLm and auxiliary data lines DLa. The main data lines DLm may be connected to the first pixel circuits PCm, and the auxiliary data lines DLa may be connected to the second pixel circuits PCa. The main data lines DLm may extend in the y-direction and be connected to the first pixel circuits PCm arranged in the same column. The auxiliary data lines DLa may extend in the y-direction and be connected to the second pixel circuits PCa arranged in the same column.

The main data lines DLm and the auxiliary data lines DLa are connected through the data connection line DWL to connect the first and second pixel circuits driving the first sub-pixels Pm and the second sub-pixels Pa arranged on the same column.

The data connection line DWL may detour the component area CA. The data connection line DWL may overlap the first pixel circuits PCm arranged in the main display area MDA. Since the data connection line DWL is arranged in the main display area MDA, a separate space for the data connection line DWL may not be required, thus a dead space may be reduced.

The data connection line DWL is arranged on a layer different from the main data line DLm and the auxiliary data line DLa and may be connected to the main data line DLm and the auxiliary data line DLa through contact holes.

Figure 5:
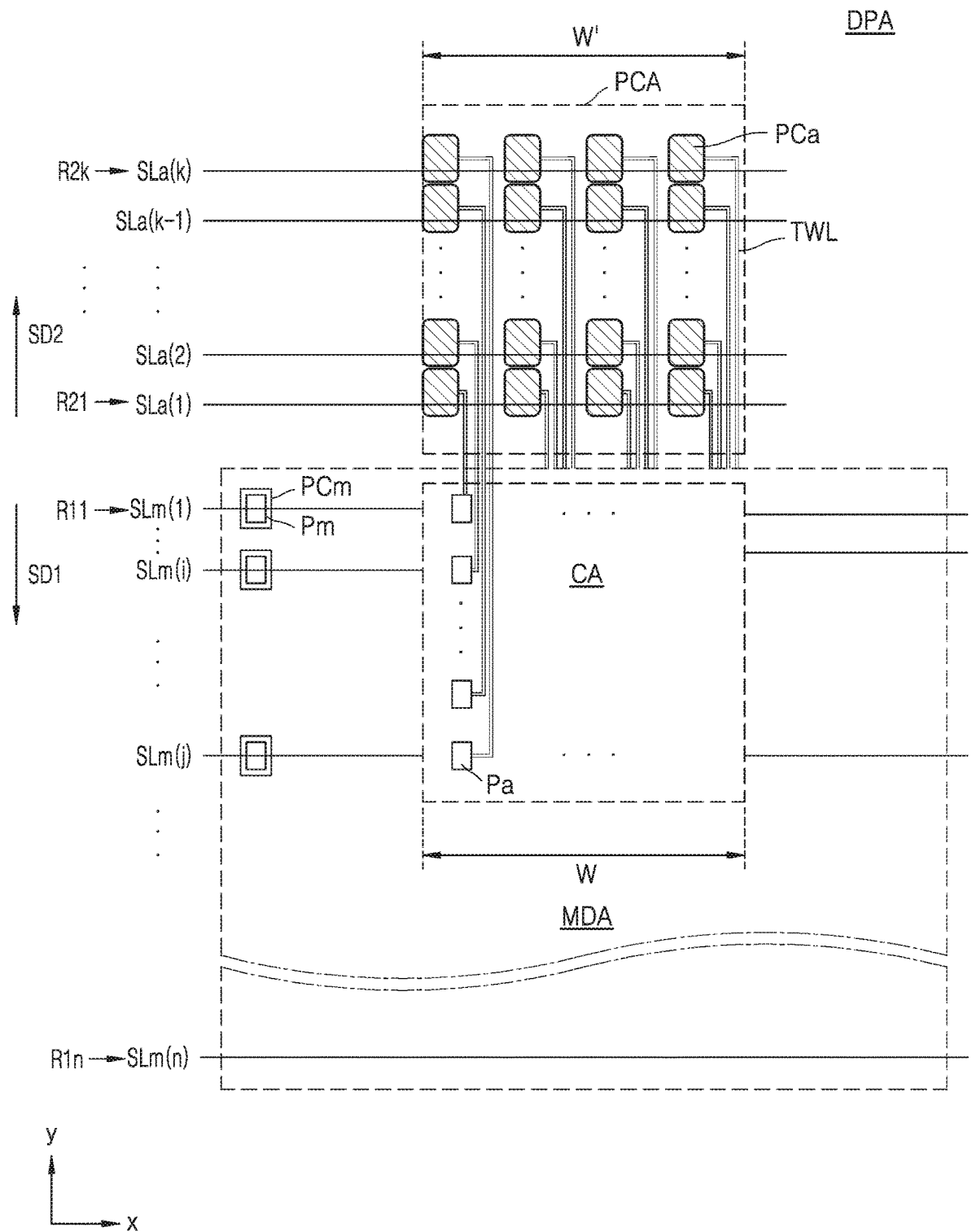
FIG. 5 is a plan view of the arrangement of a main scan line SLm and an auxiliary scan line SLa according to an embodiment.
Figure 6:
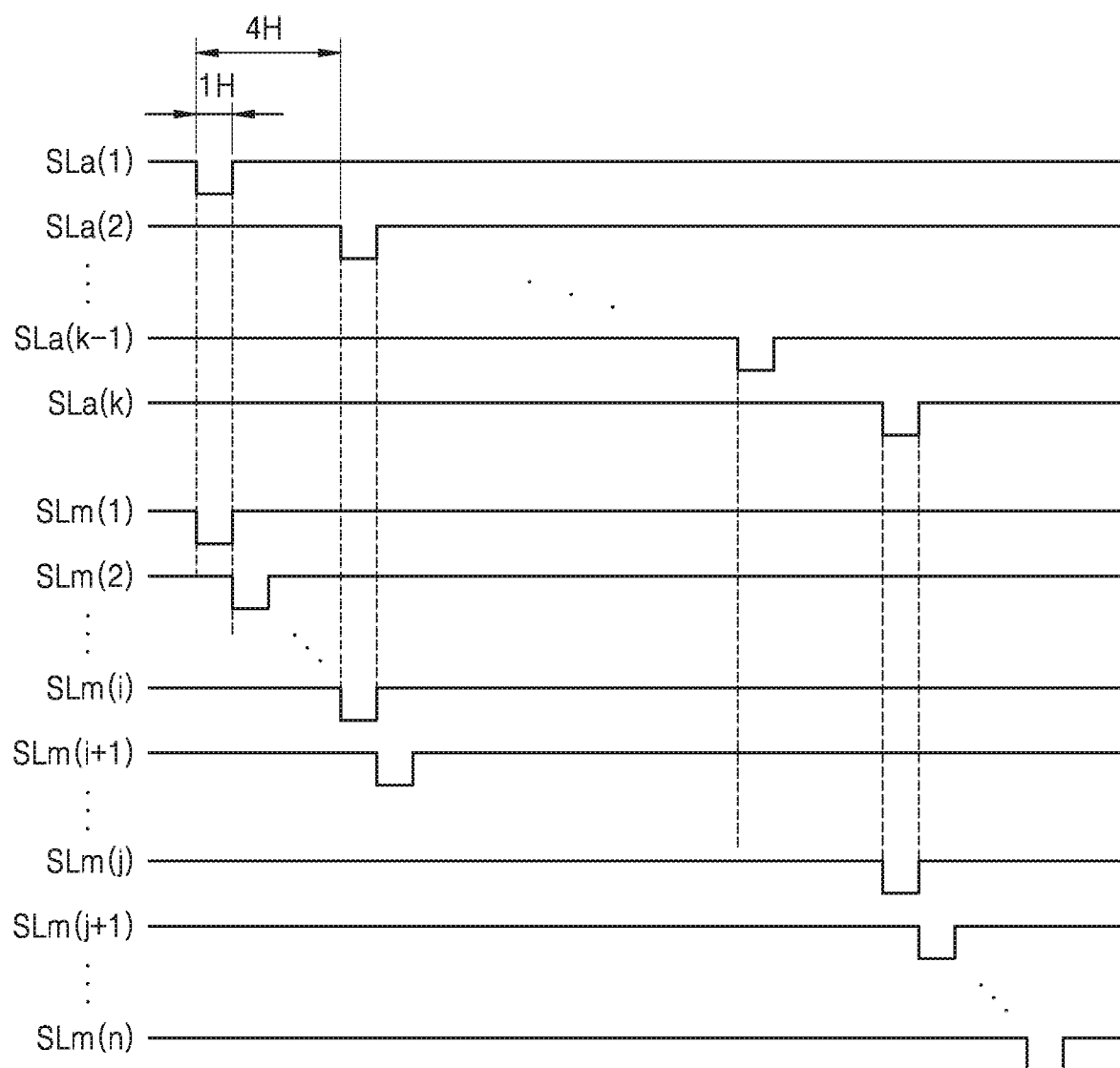
FIG. 6 is a timing diagram showing a scan signal applied to the main scan line SLm and the auxiliary scan line SLa of FIG. 5.

FIG. 5 is a plan view of the arrangement of the main scan line SLm and the auxiliary scan line SLa according to an embodiment. FIG. 6 is a timing diagram showing a scan signal applied to the main scan line SLm and the auxiliary scan line SLa of FIG. 5.

Referring to FIG. 5, the pixel circuit area PCA in which the second pixel circuits PCa are arranged in the peripheral area DPA may neighbor the component area CA. In the case where k second sub-pixels Pa arranged in the component area CA are arranged in the y-direction, k second pixel circuits PCa may be arranged in the y-direction in the peripheral area DPA. In this case, the connection line TWL may extend in the y-direction. The pixel circuit area PCA may be arranged over the component area CA, and a width W' of the pixel circuit area PCA may be substantially the same as a width W of the component area CA. In another embodiment, the second pixel circuits PCa may be formed to have the width W' of the pixel circuit area PCA greater than the width W of the component area CA.

First to n-th rows R11 to R1n may be rows in which the first pixel circuits PCm are arranged in the main display area MDA. First to k-th rows R21 to R2k may be rows in which the second pixel circuits PCa are arranged in the pixel circuit area PCA. Here, k is an integer equal to or less than n.

The main scan lines SLm may include first to n-th main scan lines SLm(1) to SLm(n) arranged in a corresponding row among first to n-th rows R11 to R1n in the main display area MDA. The auxiliary scan lines SLa may include first to k-th auxiliary scan lines SLa(1) to SLa(k) arranged in a corresponding row among first to k-th rows R21 to R2k in the pixel circuit area PCA.

The main scan lines SLm may transfer first scan signals applied from the first scan driving circuit SDRV1 and the third scan driving circuit SDRV3 to the first pixel circuits PCm. The auxiliary scan lines SLa may transfer second scan signals applied from the second scan driving circuit SDRV2 and the fourth scan driving circuit SDRV4 to the second pixel circuits PCa. That is, the first pixel circuits PCm and the second pixel circuits PCa may be independently controlled by separate driving circuits.

Referring to FIG. 6, the first scan driving circuit SDRV1 and the third scan driving circuit SDRV3 may sequentially apply first scan signals to the first pixel circuits PCm in a first scan direction SD1 from the first to n-th rows R11 to R1n in the main display area MDA through the first to n-th main scan lines SLm(1) to SLm(n). A first scan signal may have an on-voltage during one horizontal period 1H. A scan signal having the one horizontal period 1H shifted from the previous scan signal is sequentially provided to the first to n-th main scan lines SLm(1) to SLm(n). Here, the on-voltage may be a turn-on voltage of a transistor. The on-voltage may have a voltage of a low level or a voltage of a high level depending on a type of TFT used.

The second scan driving circuit SDRV2 and the fourth scan driving circuit SDRV4 may sequentially apply a second scan signal to the second pixel circuits PCa in a second scan direction SD2 from the first to k-th rows R21 to R2k in the pixel circuit area PCA through first to k-th auxiliary scan lines SLa(1) to SLa(k). A second scan signal may have the same width as a first scan signal and be shifted and output by an interval longer than an output interval of the first scan signal. In an embodiment, a second scan signal may have an on-voltage during one horizontal period 1H. A scan signal having the several horizontal period shifted from the previous scan signal is sequentially provided to the first to k-th auxiliary scan lines SLa(1) to SLa(k). As an example, a second scan signal may be shifted by 4H from a previous second scan signal. Here, the on-voltage may be a turn-on voltage of a transistor. The on-voltage may have a voltage of a low level or a voltage of a high level depending on a type of TFT used.

Though FIGS. 5 and 6 show an example in which a first scan direction SD1 is opposite to a second scan direction SD2, the first scan direction SD1 and the second scan direction SD2 may have the same direction depending on connection structure between the second sub-pixel Pa in the component area CA and the second pixel circuit PCa in the peripheral area DPA in another embodiment.

Figure 7:
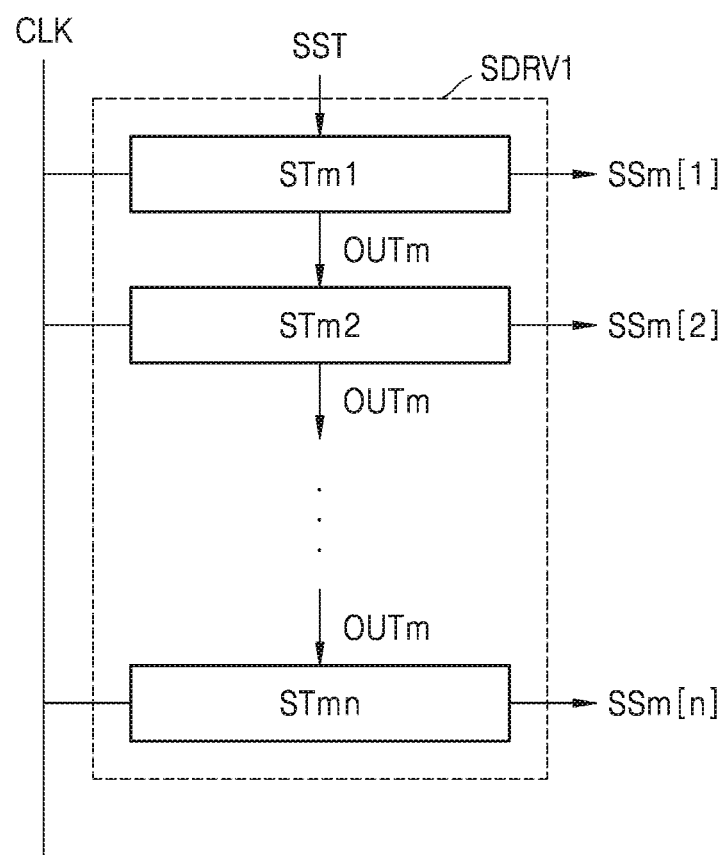
FIGS. 7 and 8 are block diagrams of a scan driving circuit according to an embodiment.
Figure 8:
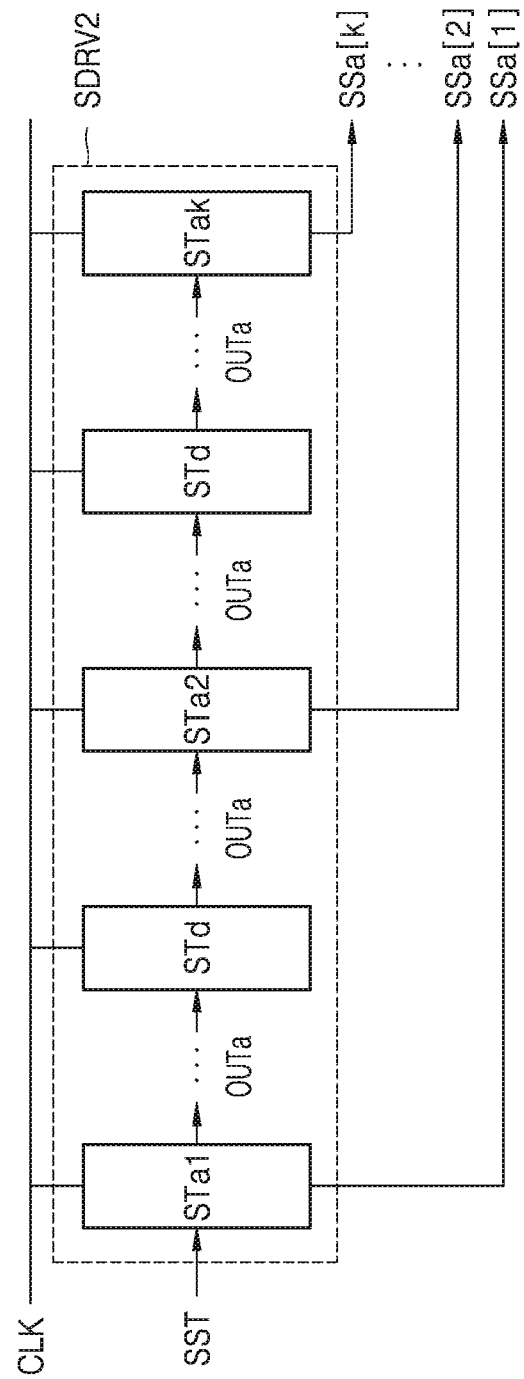
Figure 9:
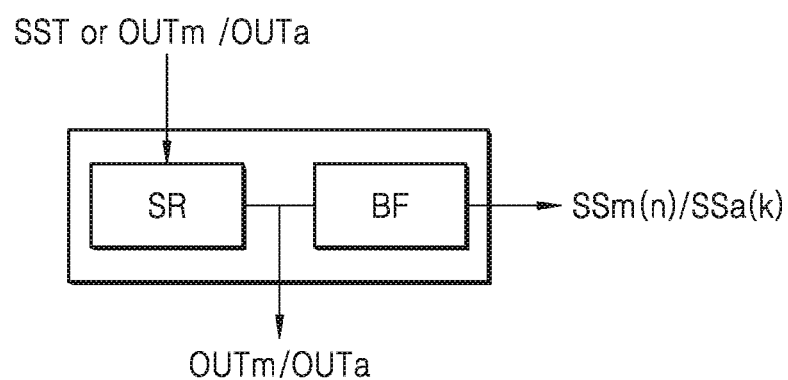
FIG. 9 is a view of scan signal output blocks of the scan driving circuit of FIGS. 7 and 8.

FIGS. 7 and 8 are block diagrams of a scan driving circuit according to an embodiment. FIG. 9 is a view of scan signal output blocks of the scan driving circuit of FIGS. 7 and 8. FIG. 7 corresponds to the first scan driving circuit SDRV1 of FIG. 3, and FIG. 8 corresponds to the second scan driving circuit SDRV2 of FIG. 3. For convenience of description, the first scan driving circuit SDRV1 and the second scan driving circuit SDRV2 are described as an example and the descriptions thereof are equally applicable to the third scan driving circuit SDRV3 and the fourth scan driving circuit SDRV4, respectively.

Referring to FIG. 7, the first scan driving circuit SDRV1 may include a plurality of first stages STm1, STm2, ..., STmn that are subordinately connected. The plurality of first stages STm1, STm2, ..., STmn may respectively output first scan signals SSm[1], SSm[2], ..., SSm[n]. The first stage STm1 among the plurality of first stages STm1, STm2, ..., STmn may output a first scan signal SSm[1] in response to a start signal SST, and the rest of first stages STm2, ..., STmn excluding the first stage STm1 may receive, as a start signal, a carry signal OUTm from the previous first stages.

First scan signals sequentially output from the plurality of first stages STm1, STm2, ..., STmn may be applied to the first pixel circuits PCm through the first to n-th main scan lines SLm(1) to SLm(n) arranged in the first to n-th rows R11 to R1n in the main display area MDA as shown in FIG. 6. That is, a first scan signal may be output in the form in which a signal of a low level has a width of 1 horizontal period 1H and is shifted by the 1 horizontal period 1H.

Referring to FIG. 8, the second scan driving circuit SDRV2 may include a plurality of second stages STa1, STa2, ..., STak that are subordinately connected. The plurality of second stages STa1, STa2, ..., STak may respectively output second scan signals SSa[1], SSa[2], ..., SSa[k]. Dummy stages STd may be arranged between the plurality of second stages STa1, STa2, ..., STak. The number of dummy stages STd arranged between adjacent second stages may be determined by an output interval of a second scan signal. As an example, in the case where a second scan signal SSa[2] output by the second second stage STa2 is shifted by 4H from a second signal SSa[1] output by the first second stage STa1, three dummy stages STd may be arranged between the first second stage STa1 and the second second stage STa2.

Among the plurality of second stages STa1, STa2, ..., STak and the plurality of dummy stages STd, the first second stage STa1 may output a second scan signal in response to a start signal SST, and the rest of the second stages STa2, ..., STak, and the dummy stages STd excluding the first second stage STa1 may receive, as a start signal, a carry signal OUTa from the previous stages.

Second scan signals that are sequentially output by the plurality of second stages STa1, STa2, ..., STak may be applied to the second pixel circuits PCa through the first to k-th auxiliary scan lines SLa(1) to SLa(k) arranged in the first to k-th rows R21 to R2k in the pixel circuit area PCA as shown in FIG. 6. That is, a second scan signal may have a low level during 1 horizontal period 1H. The second scan signal may have a low level shifted by four horizontal periods 4H from the previous second scan signal.

The first scan driving circuit SDRV1 and the second scan driving circuit SDRV2 may be connected to a plurality of signal wirings. The plurality of signal wirings may include a start signal line applying a start signal SST and at least one clock line applying a clock signal CLK. At least one voltage line may be further connected to the first scan driving circuit SDRV1 and the second scan driving circuit SDRV2. The first scan driving circuit SDRV1 and the second scan driving circuit SDRV2 may share the start signal line and at least one clock line. That is, applying timing of a start signal SST and a clock signal CLK applied to the first scan driving circuit SDRV1 and the second scan driving circuit SDRV2 may be the same.

Circuit configurations of the first stages STm1, STm2, ..., STmn, the second stages STa1, STa2, ..., STak, and the dummy stages may be the same. Referring to FIG. 9, each of the plurality of first stages STm1, STm2, ..., STmn of the first scan driving circuit SDRV1, the plurality of second stages STa1, STa2, ..., STak of the second scan driving circuit SDRV2, and the dummy stages STd may include a shift stage SR and an output buffer BF.

The shift stage SR may receive a start signal or carry signals OUTm and OUTa from the previous stages and output carry signals OUTm and OUTa. In an embodiment, the shift stage SR may be implemented as a flip-flop. The first stages STm1, STm2, ..., STmn of the first scan driving circuit SDRV1 may be a shift register. The second stages STa1, STa2, ..., STak of the second scan driving circuit SDRV2, and the dummy stages STd may be a shift register.

The output buffer BF may receive carry signals OUTm and OUTa and output scan signals SSm[n] and SSa[k]. As an example, the output buffer BF may improve an edge (e.g. a rising edge and a falling edge) characteristic of carry signals OUTm and OUTa and perform level shifting on carry signals OUTm and OUTa.

A speed at which a scan signal is applied to a scan line may be determined depending on the size (or capacity) of the output buffer BF. As an example, when the size of the output buffer BF is large, a scan line may be charged fast. When the size of the output buffer BF is small, a scan line may be charged slowly. Accordingly, when the size of the output buffer BF is large, an RC delay of a scan signal output from the output buffer BF may be reduced. When the size of the output buffer BF is small, an RC delay of a scan signal output from the output buffer BF may be increased. The size of the output buffer BF may be determined by the size of elements (e.g. a transistor, etc.) included in the output buffer BF.

Figure 10:
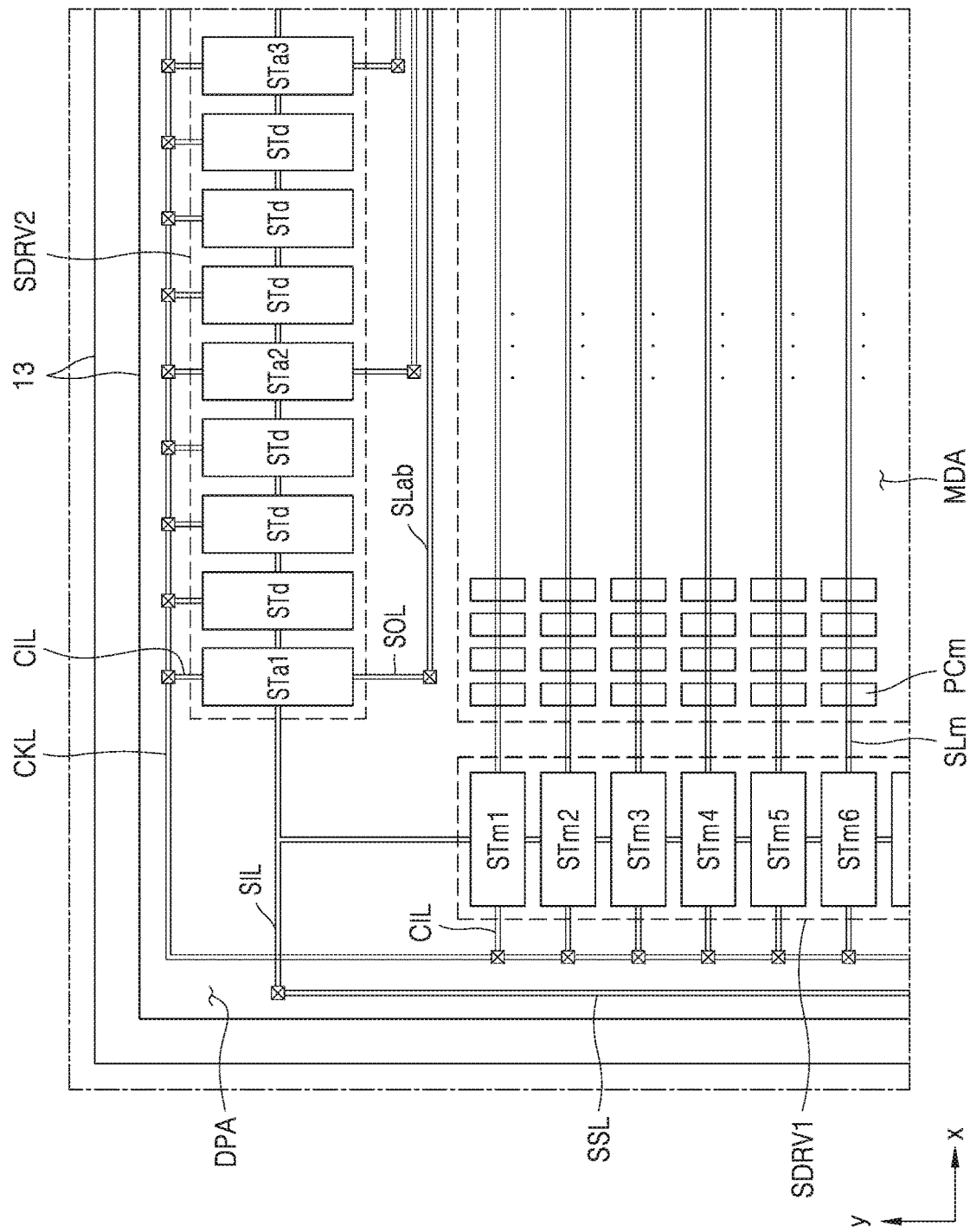
FIG. 10 is an enlarged plan view of region A of FIG. 3 according to an embodiment.
Figure 11:
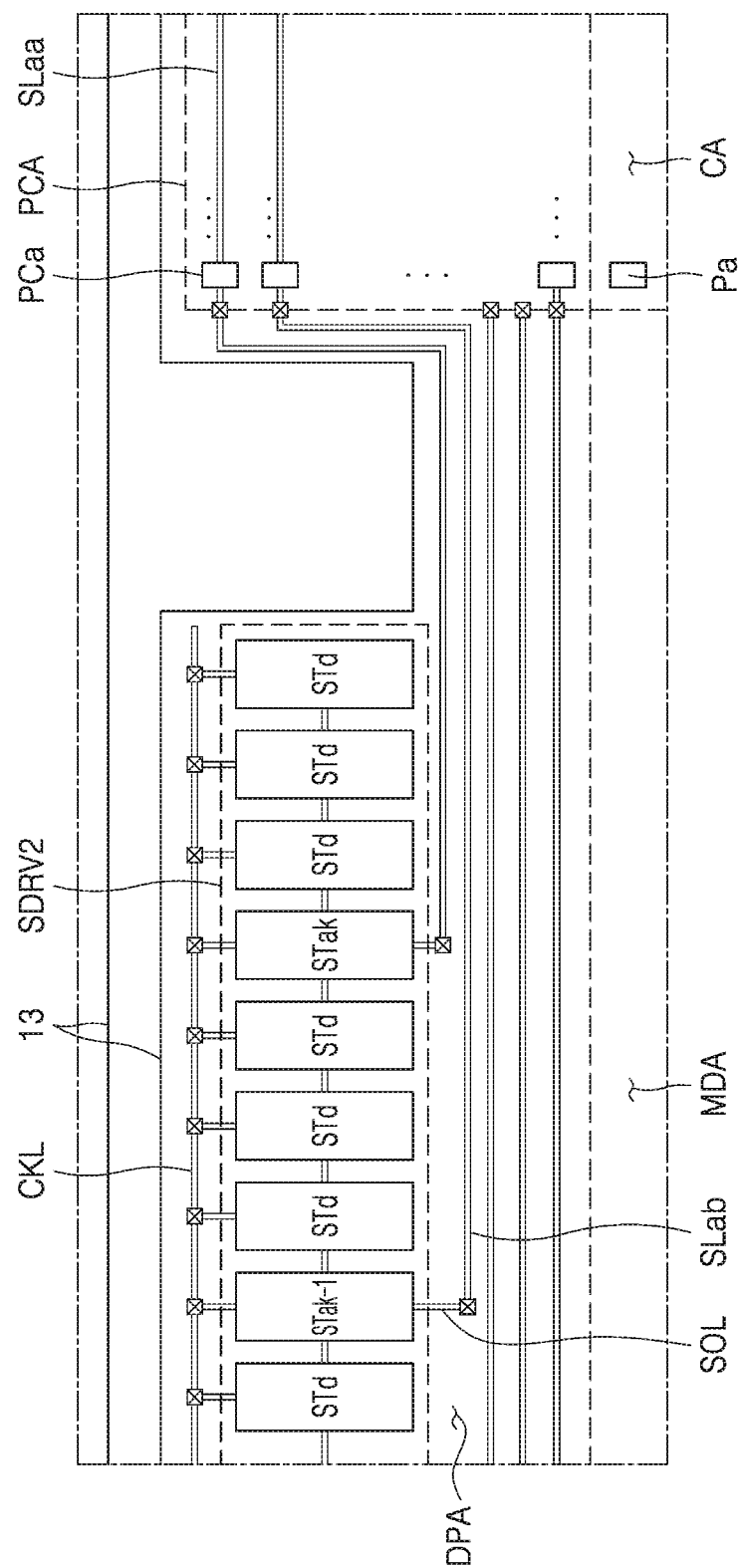
FIG. 11 is an enlarged plan view of region B of FIG. 3 according to an embodiment.
Figure 12A:
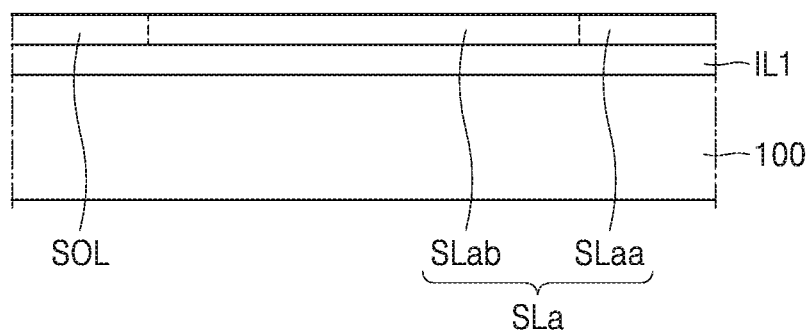
FIGS. 12A and 12B are cross-sectional views of an auxiliary scan line SLa.
Figure 12B:
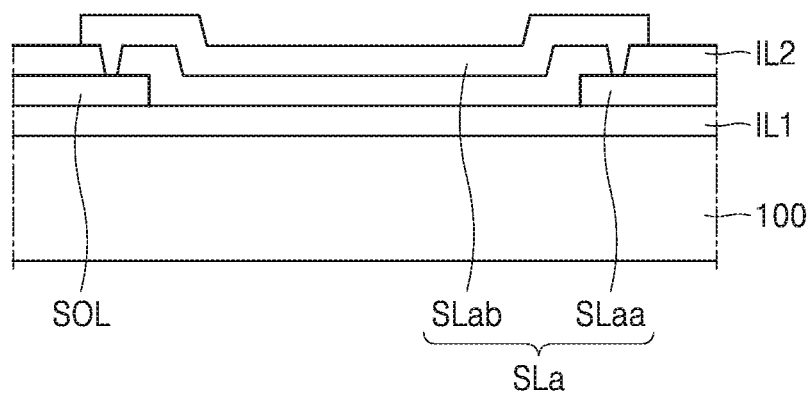

FIG. 10 is an enlarged plan view of a region A of FIG. 3 according to an embodiment. FIG. 11 is an enlarged plan view of a region B of FIG. 3 according to an embodiment. FIGS. 12A and 12B are cross-sectional views of an auxiliary scan line SLa.

Referring to FIG. 10, a plurality of first stages STm1, STm2, . . . , STmn of the first scan driving circuit SDRV1 may be arranged in the y-direction in the left of the peripheral area DPA of the substrate 100. The first scan driving circuit SDRV1 may be arranged between the common voltage supply line 13 and the main display area MDA.

Referring to FIGS. 10 and 11, the plurality of second stages STa1, STa2, . . . , STak of the second scan driving circuit SDRV2 may be arranged in the x-direction in the upper left of the peripheral area DPA of the substrate 100. The second scan driving circuit SDRV2 may be arranged between the common voltage supply line 13 and the main display area MDA. The dummy stages STd may be arranged between adjacent second stages of the second scan driving circuit SDRV2. Each of the dummy stages STd may receive, as a start signal, a carry signal output by a second stage or a dummy stage disposed just before the each of the dummy stages STd.

A start signal line SSL and/or a clock line CKL may be arranged between the common voltage supply line 13 and the first scan driving circuit SDRV1 and between the common voltage supply line 13 and the second scan driving circuit SDRV2.

The start signal line SSL may extend in the y-direction along the first scan driving circuit SDRV1. The start signal line SSL may be connected to the first stage STm1 of the first scan driving circuit SDRV1 and the first stage STa1 of the second scan driving circuit SDRV2. The start signal line SSL may be arranged on a layer different from a signal input line SIL of the first stage STm1 of the first scan driving circuit SDRV1 and the first stage STa1 of the second scan driving circuit SDRV2 and connected to the signal input line SIL through a contact hole. A portion of the signal input line SIL may extend in the x-direction across the clock line CKL and branch to be connected to the first stage STm1 of the first scan driving circuit SDRV1 and the first stage STa1 of the second scan driving circuit SDRV2. In another embodiment, a start signal line of the first scan driving circuit SDRV1 and a start signal line of the second scan driving circuit SDRV2 may be separately provided. In this case, a scan direction of the first pixel circuit PCm and a scan direction of the second pixel circuit PCa may be set differently by setting independent timing of start signals.

The clock line CKL may extend in the y-direction along the first scan driving circuit SDRV1, be bent at the corner of the display panel 10, and then may extend in the x-direction along the second scan driving circuit SDRV2. The clock line CKL may be arranged on the same layer as the start signal line SSL. The clock line CKL may be connected to the plurality of first stages STm1, STm2, . . . , STmn of the first scan driving circuit SDRV1, the plurality of second stages STa1, STa2, . . . , STak of the second scan driving circuit SDRV2 and the dummy stages STd of the second scan driving circuit SDRV2. A clock input line CIL of each of the plurality of first stages STm1, STm2, . . . , STmn of the first scan driving circuit SDRV1, the plurality of second stages STa1, STa2, . . . , STak and the dummy stages STd of the second scan driving circuit SDRV2 may be arranged on a layer different from the clock line CKL and be connected to the clock line CKL through a contact hole. Though FIGS. 10 and 11 show one clock line CKL, this is shown as an example and two or more clock lines may neighbor each other depending on a circuit configuration of a stage.

The main scan line SLm may be connected to each of the first stages STm1, STm2, . . . , STmn. The main scan line SLm may be a line extending to the main display area MDA from each of output lines of the first stages STm1, STm2, . . . , STmn.

The auxiliary scan line SLa may be connected to each of the second stages STa1, STa2, . . . , STak. The auxiliary scan line SLa may include a first auxiliary scan line SLaa and a second auxiliary scan line SLab.

First auxiliary scan lines SLaa may extend in the x-direction in the pixel circuit area PCA and be connected to the second pixel circuits PCa disposed in a corresponding pixel row. Second auxiliary scan lines SLab may connect output lines SOL of the second stages STa1, STa2, . . . , STak to the first auxiliary scan lines SLaa. The second auxiliary scan lines SLab may be arranged between the second scan driving circuit SDRV2 and the main display area MDA in the peripheral area DPA and may extend in the x-direction. The second auxiliary scan lines SLab may be spaced apart from each other with an approximately constant interval. In an embodiment, the second auxiliary scan lines SLab may be space apart from each other on the same layer. In another embodiment, the second auxiliary scan lines SLab may be alternately arranged on different layers to reduce a wiring interval, and thus, reduce a dead space. The second auxiliary scan lines SLab may have different lengths depending on the locations of the second stages STa1, STa2, . . . , STak. As an example, when the second auxiliary scan line SLab is connected to a stage closer to the pixel circuit area PCA, the length of the second auxiliary scan line SLab may be shorter.

In an embodiment, the output line SOL, the first auxiliary scan line SLaa, and the second auxiliary scan line SLab may be arranged on the same layer. As an example, as shown in FIG. 12A, the output line SOL, the first auxiliary scan line SLaa, and the second auxiliary scan line SLab may be formed in one piece and be arranged on a first insulating layer IL1 In another embodiment, the output line SOL and the first auxiliary scan line SLaa may be arranged on the same layer, and the second auxiliary scan line SLab may be arranged on a layer different from the output line SOL and the first auxiliary scan line SLaa is arranged and connected to the output line SOL and the first auxiliary scan line SLaa through contact holes. As an example, as shown in FIG. 12B, the output line SOL and the first auxiliary scan line SLaa may be arranged on the first insulating layer IL1, and the second auxiliary scan line SLab may be arranged on a second insulating layer IL2 and connected to the output line SOL and the first auxiliary scan line SLaa through contact holes formed in the second insulating layer IL2. The first insulating layer IL1 and the second insulating layer IL2 may be single-layered or multi-layered inorganic insulating layers.

In an embodiment, an output buffer size of the second stages STa1, STa2, . . . , STak of the second scan driving circuit SDRV2 may be different from an output buffer size of the first stages STm1, STm2, . . . , STmn of the first scan driving circuit SDRV1.

In addition, in an embodiment, output buffer sizes of the second stages STa1, STa2, . . . , STak of the second scan driving circuit SDRV2 and the dummy stages STd may be the same or different from each other. As an example, as a stage is closer to the pixel circuit area PCA, the size of an output buffer of the stage may be small. The sizes of output buffers of the second stages STa1, STa2, . . . , STak may be proportional to the length of the auxiliary scan line SLa or the length of the second auxiliary scan line SLab. The length of a second auxiliary scan line SLab may become short and the size of an output buffer may become small toward the last second stage STak from the first second stage STa1.

Figure 13:
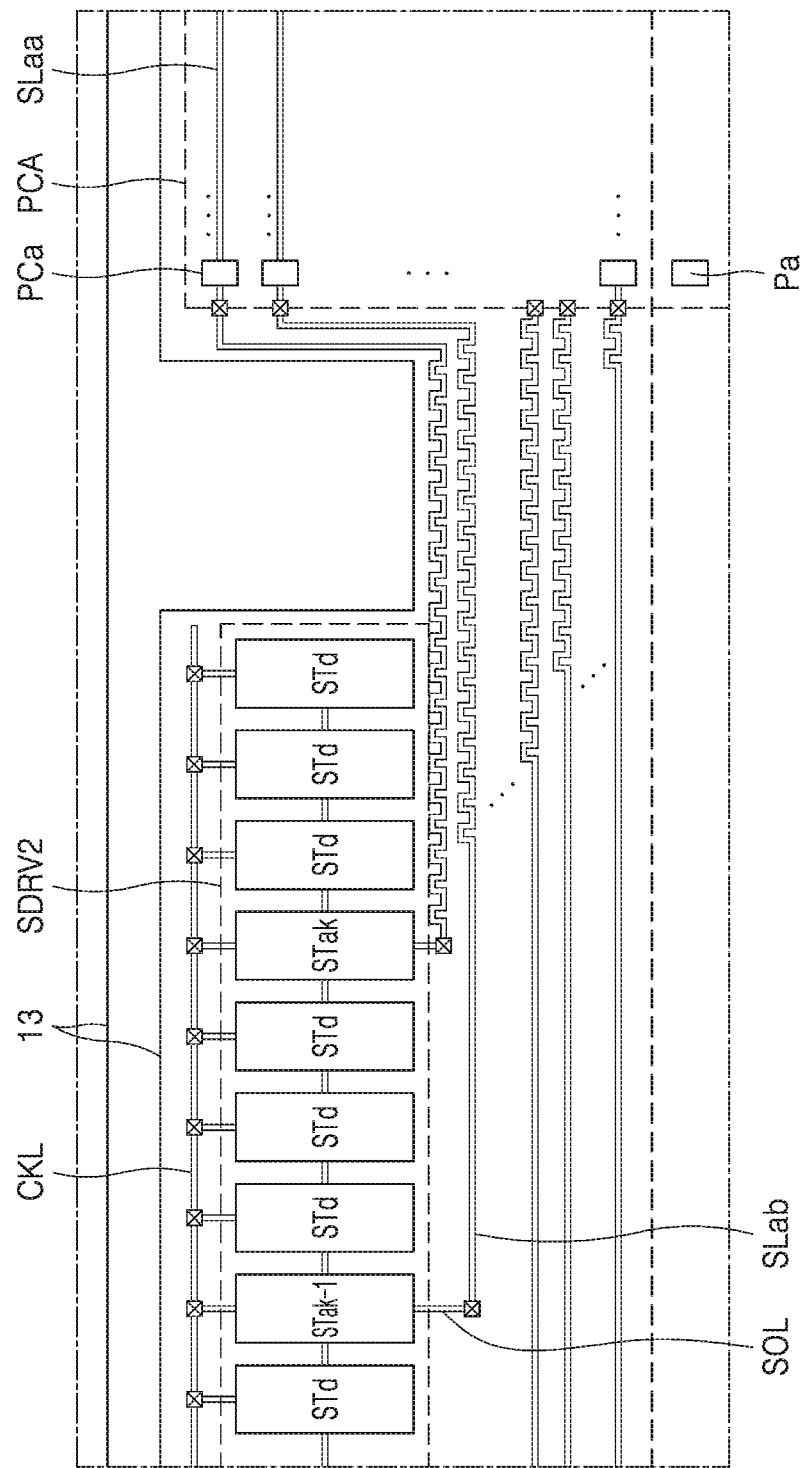
FIGS. 13 and 14 are views of a second auxiliary scan line according to an embodiment.
Figure 14:
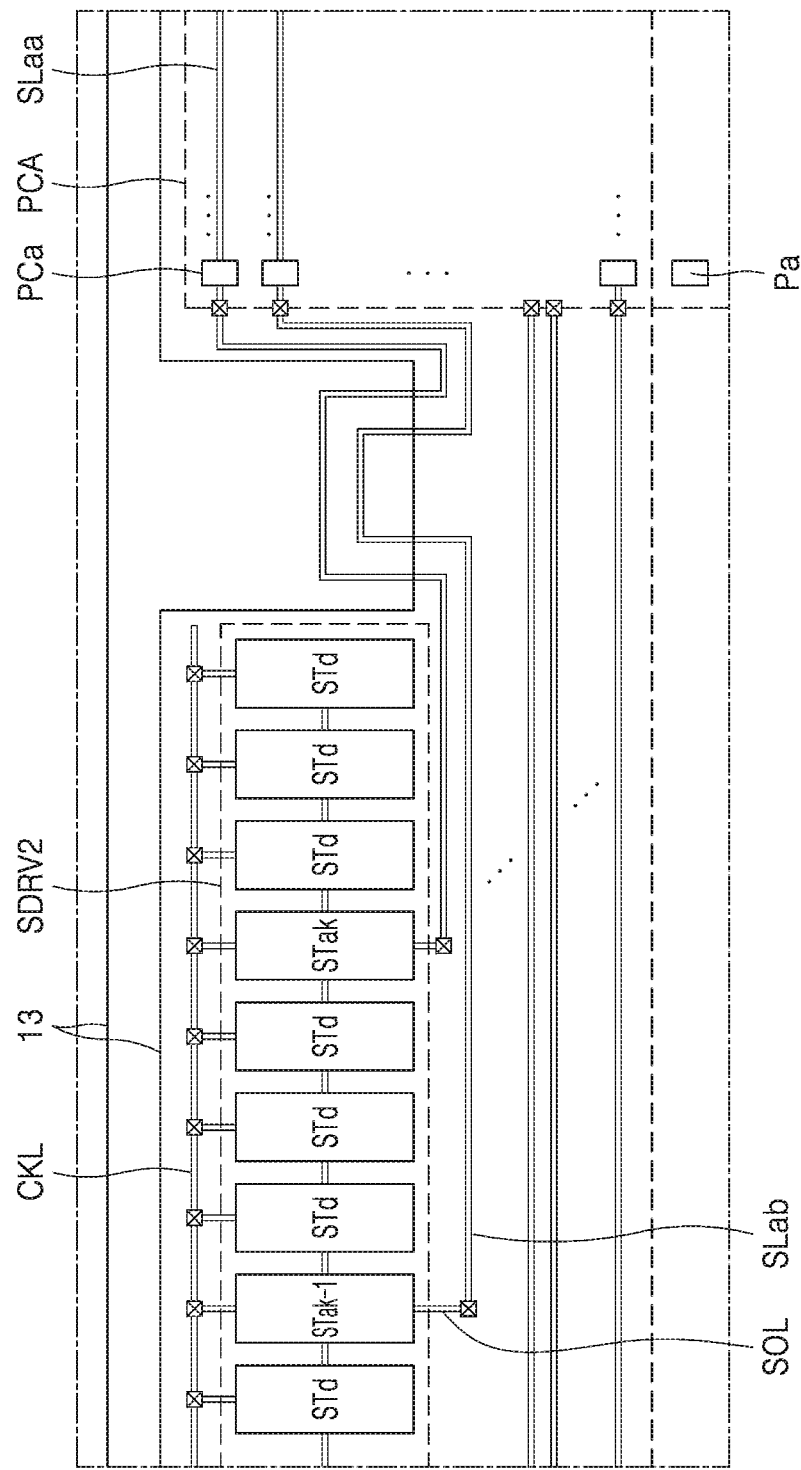

FIGS. 13 and 14 are views of a second auxiliary scan line according to an embodiment. FIGS. 13 and 14 may correspond to a region B of FIG. 3.

Referring to FIG. 13, some of the second auxiliary scan lines SLab may have bent portions (e.g. a zigzag pattern) in a partial region. The length of the second auxiliary scan lines SLab is not uniform depending on locations of the second stages STa1, STa2, . . . , STak and the second pixel circuits PCa, thus the difference in lengths of the second auxiliary scan lines SLab may cause different RC delays of the second auxiliary scan lines SLab. In an embodiment, the bent portions may be formed in the second auxiliary scan lines SLab to reduce a length deviation between the second auxiliary scan lines SLab. As an example, differences in lengths between the second auxiliary scan lines SLab may be compensated for by forming the bent portions (or the number of zigzag patterns). The bent portions may be continuously provided or provided discontinuously in the auxiliary scan lines SLab. A shape of the bent portions is not particularly limited.

Referring to FIG. 14, a portion of some of the second auxiliary scan lines SLab may overlap the common voltage supply line 13. Depending on the area of the overlapping region of the common voltage supply line 13 and the second auxiliary scan line SLab, a capacitance between the common voltage supply line 13 and the second auxiliary scan line SLab may be changed. The area of the overlapping region of the common voltage supply line 13 and the second auxiliary scan line SLab may be determined to reduce (minimize) the differences in RC delays between the second auxiliary scan lines SLab. As an example, the area of the overlapping region of the common voltage supply line 13 and the second auxiliary scan line SLab may be large as the length of a straight line of the second auxiliary scan line SLab is short, or the second auxiliary scan line SLab is connected to a second stage closer to the pixel circuit area PCA. A portion in which the second auxiliary scan line SLab overlaps the common voltage supply line 13 may have bent portions.

Though not shown, in another embodiment, differences in RC delays between the second auxiliary scan lines SLab may be reduced by adjusting the width of the second auxiliary scan lines SLab.

Figure 15:
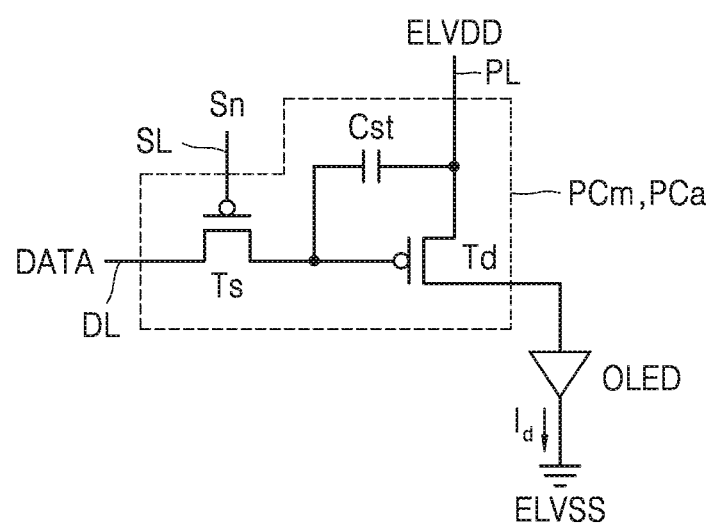
FIGS. 15 and 16 are equivalent circuit diagrams of a pixel circuit configured to drive first and second sub-pixels Pm and Pa.
Figure 16:
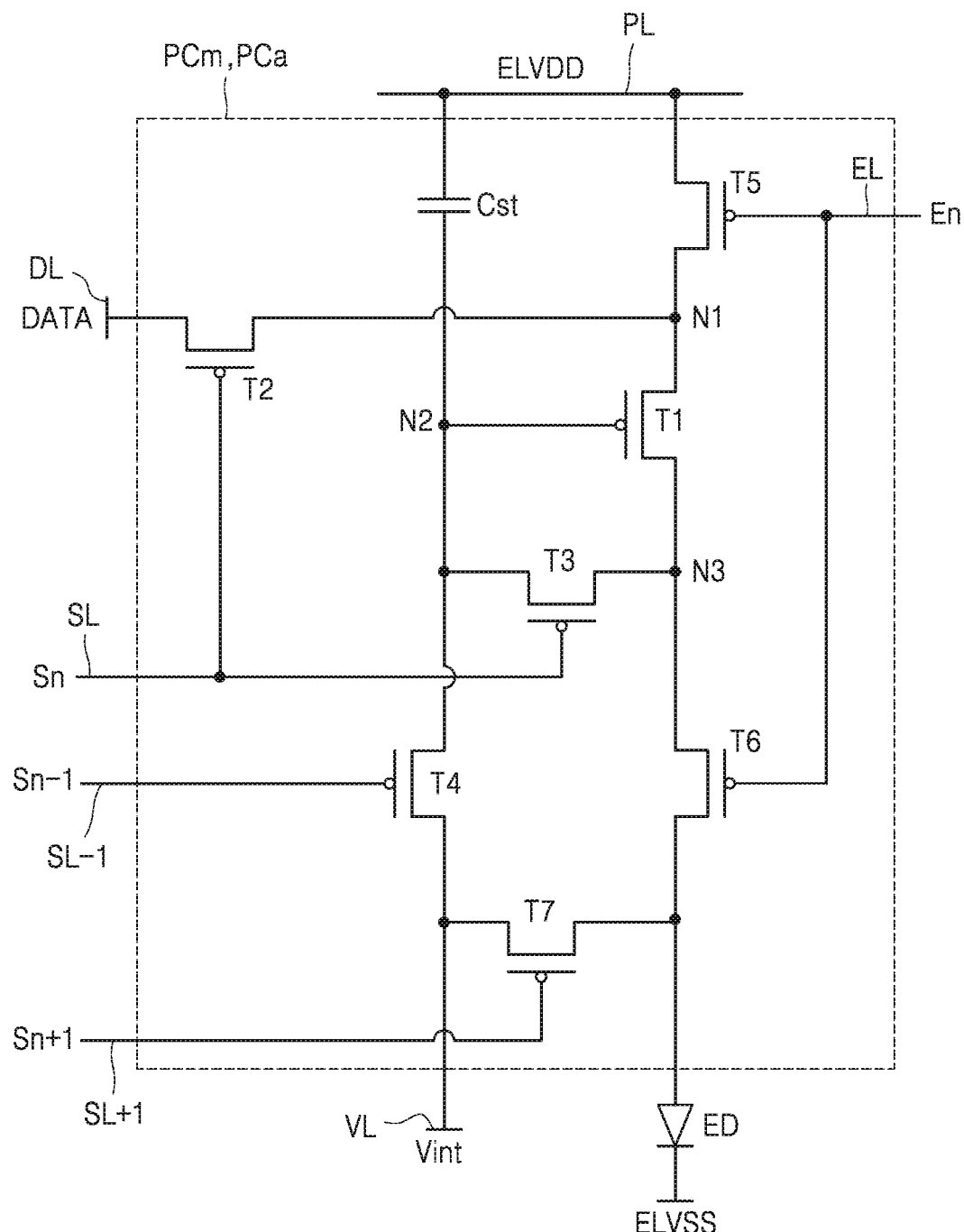

FIGS. 15 and 16 are equivalent circuit diagrams of a pixel circuit configured to drive the first and second sub-pixels Pm and Pa.

Referring to FIG. 15, each of the pixel circuits which include the first pixel circuit PCm and the second pixel circuit PCa may be connected to a light-emitting element of a sub-pixel to control luminance of the sub-pixel. The light-emitting element may be an organic light-emitting diode OLED. Each of the pixel circuits that includes the first pixel circuit PCm and the second pixel circuit PCa may include a driving transistor T1, a switching transistor T2, and a capacitor Cst. The switching transistor T2 is connected to a scan line SL and a data line DL and transfers a data signal DATA to the driving transistor T1 in response to a scan signal Sn input through the scan line SL. The data signal DATA may be input through the data line DL.

The capacitor Cst is connected between a control electrode of the driving transistor and a driving voltage line PL. The capacitor Cst may store a voltage difference between the transferred data signal DATA and a driving voltage ELVDD supplied to the driving voltage line PL.

The driving transistor T1 is connected between the driving voltage line PL and the organic light-emitting diode OLED and may control a driving current flowing from the driving voltage line PL to the organic light-emitting diode OLED according to the voltage stored in the capacitor Cst. The organic light-emitting diode OLED may emit light having a preset brightness according to the driving current.

Though each of the pixel circuits in FIG. 15, each of the first pixel circuit PCm and the second pixel circuit PCa, includes two thin-film transistors and one capacitor, the embodiment is not limited thereto.

The pixel circuits, that is, the first pixel circuit PCm and the second pixel circuit PCa, may include first to seventh transistors T1, T2, T3, T4, T5, T6, and T7. A first terminal of each of the first to seventh transistors T1, T2, T3, T4, T5, T6, and T7 may be a source and a second terminal of each of the first to seventh transistors T1, T2, T3, T4, T5, T6, and T7 may be a drain. The source and the drain of each of the first to seventh transistors T1, T2, T3, T4, T5, T6, and T7 may be determined depending on the kind of the transistor (a p-type or an n-type) and/or an operation condition of the first to seventh transistors T1, T2, T3, T4, T5, T6, and T7.

The pixel circuits, that is, the first pixel circuit PCm and the second pixel circuit PCa, may be connected to a first scan line SL, a second scan line SL−1, a third scan line SL+1, an emission control line EL, a data line DL, the driving voltage line PL, and an initialization voltage line VL. The first scan line SL may transfer a scan signal Sn, the second scan line SL−1 may transfer a scan signal Sn−1, the third scan line SL+1 may transfer a scan signal Sn+1, the emission control line EL may transfer an emission control signal En, the data line DL may transfer a data signal DATA, the driving voltage line PL may transfer the driving voltage ELVDD, and the initialization voltage line VL may transfer an initialization voltage Vint to the pixel circuits.

The first transistor T1 includes a gate electrode, a first terminal, and a second terminal. The gate electrode of the first transistor T1 is connected to a second node N2, the first terminal of the first transistor T1 is connected to a first node N1, and the second terminal of the first transistor T1 is connected to a third node N3. The first transistor T1 serves as a driving transistor. The first terminal of the first transistor T1 receives a data signal DATA through the second transistor T2 and stores the data signal to the capacitor Cst. The first transistor T1 supplies the driving current to the light-emitting element according to a voltage stored in the capacitor Cst. The light-emitting element may be an organic light-emitting diode OLED.

The second transistor T2 (a switching transistor) includes a gate terminal, a first terminal, and a second terminal. The gate terminal is connected to the first scan line SL, the first terminal is connected to the data line DL, and the second terminal is connected to the first node N1 (or the first terminal of the first transistor T1). The second transistor T2 may be turned on in response to a scan signal Sn transferred through the first scan line SL and may perform a switching operation to transfer the data signal DATA to the first node N1.

The third transistor T3 (a compensation transistor) includes a gate terminal, a first terminal, and a second terminal. The gate terminal is connected to the first scan line SL, the first terminal is connected to the second node N2 (or the gate terminal of the first transistor T1), and the second terminal is connected to the third node N3 (or the second terminal of the first transistor T1). The third transistor T3 may be turned on in response to a scan signal Sn transferred through the first scan line SL and may diode-connect the first transistor T1 to compensate a threshold voltage of the first transistor T1. The third transistor T3 may have a structure in which two or more transistors are connected in series.

The fourth transistor T4 (a first initialization transistor) includes a gate terminal, a first terminal, and a second terminal. The gate terminal is connected to the second scan line SL−1, the first terminal is connected to the initialization voltage line VL, and the second terminal is connected to the second node N2. The fourth transistor T4 may be turned on in response to a scan signal Sn−1 transferred through the second scan line SL−1 to initialize the gate voltage of the first transistor T1 by transferring the initialization voltage Vint to the gate terminal of the first transistor T1. The fourth transistor T4 may have a structure in which two or more transistors are connected in series.

The fifth transistor T5 (a first emission control transistor) includes a gate terminal, a first terminal, and a second terminal. The gate terminal is connected to the emission control line EL, the first terminal is connected to the driving voltage line PL, and the second terminal is connected to the first node N1. The sixth transistor T6 (a second emission control transistor) includes a gate terminal, a first terminal, and a second terminal. The gate terminal is connected to the emission control line EL, the first terminal is connected to the third node N3, and the second terminal is connected to a pixel electrode of the organic light-emitting diode OLED. The fifth transistor T5 and the sixth transistor T6 are simultaneously turned on in response to an emission control signal En transferred through the emission control line EL, and current flows through the organic light-emitting diode OLED when the fifth transistor T5 and the sixth transistor T6 are turned on.

The seventh transistor T7 (a second initialization transistor) includes a gate terminal, a first terminal, and a second terminal. The gate terminal is connected to the third scan line SL+1, the first terminal is connected to the second terminal of the sixth transistor T6 and the pixel electrode of the organic light-emitting diode OLED, and the second terminal is connected to the initialization voltage line VL. The seventh transistor T7 may be turned on according to a scan signal Sn+1 transferred through the third scan line SL+1 and may initialize a voltage of the pixel electrode of the organic light-emitting diode OLED by transferring the initialization voltage Vint to the pixel electrode of the organic light-emitting diode OLED. The seventh transistor T7 may be omitted.

The capacitor Cst includes a first electrode and a second electrode. The first electrode is connected to the second node N2 and the second electrode is connected to the driving voltage line PL.

The organic light-emitting diode OLED may include the pixel electrode and an opposite electrode. The opposite electrode faces the pixel electrode and receives the common voltage ELVSS. The driving current from the first transistor T1 may flow through the organic light-emitting diode OLED to emit light having a preset color. The opposite electrode may be provided in common, that is, the opposite electrode may be provided as one piece over a plurality of sub-pixels.

Though the fourth transistor T4 and the seventh transistor T7 are respectively connected to the second scan line SL−1 and the third scan line SL+1 in FIG. 16, the embodiment is not limited thereto. In another embodiment, both the fourth transistor T4 and the seventh transistor T7 may be connected to the first scan line SL−1, and thus, driven according to a scan signal Sn−1.

Pixel circuits that drive the first sub-pixel Pm and the second sub-pixel Pa may be the same or different from each other. As an example, a pixel circuit that drives the first sub-pixel Pm and a pixel circuit that drives the second sub-pixel Pa may be provided as the pixel circuit shown in FIG. 15. In another embodiment, a pixel circuit that drives the first sub-pixel Pm may employ the pixel circuit shown in FIG. 15, and a pixel circuit that drives the second sub-pixel Pa may employ the pixel circuit shown in FIG. 16.

Figure 17:
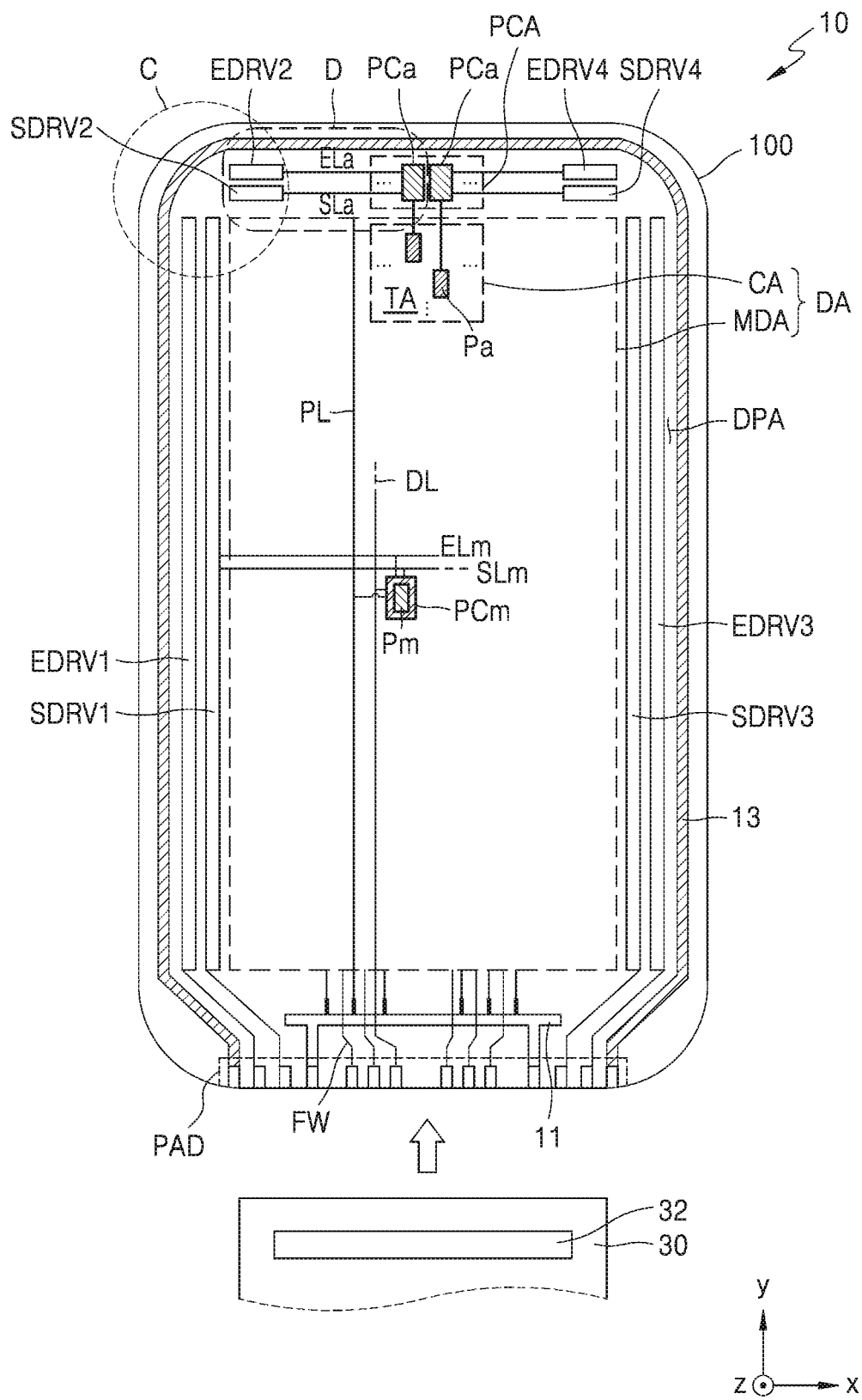
FIG. 17 is a plan view of a display panel 10' that may be included in the display apparatus of FIG. 1.

FIG. 17 is a plan view of a display panel 10 that may be included in the display apparatus of FIG. 1. Hereinafter, a configuration different from the display panel 10 of FIG. 3 is mainly described.

Referring to FIG. 17, first to fourth emission control driving circuits EDRV1, EDRV2, EDRV3, and EDRV4 may be further provided in the peripheral area DPA of the substrate 100.

The first emission control driving circuit EDRV1 (or a first main emission control driving circuit) and the third emission control driving circuit EDRV3 (or a second main emission control driving circuit) face each other with the main display area MDA interposed therebetween, and may be respectively arranged in the left peripheral area DPA and the right peripheral area DPA of the substrate 100. The first emission control driving circuit EDRV1 may be disposed close to the first scan driving circuit SDRV1. The third emission control driving circuit EDRV3 may be disposed close to the third scan driving circuit SDRV3. The first emission control driving circuit EDRV1 and the third emission control driving circuit EDRV3 may apply an emission control signal to the first pixel circuits PCm through a main emission control line ELm. Some of the first pixel circuits PCm corresponding to the first sub-pixels Pm in the main display area MDA may be connected to the first emission control driving circuit EDRV1, and the rest of the first pixel circuits PCm may be connected to the third emission control driving circuit EDRV3.

The second emission control driving circuit EDRV2 (or a first auxiliary emission control driving circuit) and the fourth emission control driving circuit EDRV4 (or a second auxiliary emission control driving circuit) may be respectively arranged on the left and right of the upper peripheral area DPA of the substrate 100 while facing each other. The second emission control driving circuit EDRV2 may neighbor the second scan driving circuit SDRV2. The fourth emission control driving circuit EDRV4 may neighbor the fourth scan driving circuit SDRV4. The second emission control driving circuit EDRV2 and the fourth emission control driving circuit EDRV4 may apply an emission control signal to the second pixel circuits PCa through an auxiliary emission control line ELa. Some of the second pixel circuits PCa corresponding to the second sub-pixels Pa may be electrically connected to the second emission control driving circuit EDRV2 and the rest of the second pixel circuits PCa may be electrically connected to the fourth emission control driving circuit EDRV4.

Each of the first to fourth emission control driving circuits EDRV1, EDRV2, EDRV3, and EDRV4 may include a plurality of stages, and each stage may include a shift stage and an output buffer as shown in FIG. 9. In an embodiment, the sizes of output buffers of the stages of the second and fourth emission control driving circuits EDRV2 and EDRV4 may be different from the sizes of output buffers of the stages of the first and third emission control driving circuits EDRV1 and EDRV3. In an embodiment, the sizes of output buffers of the stages of the second and fourth emission control driving circuits EDRV2 and EDRV4 may be the same or different from each other.

Figure 18:
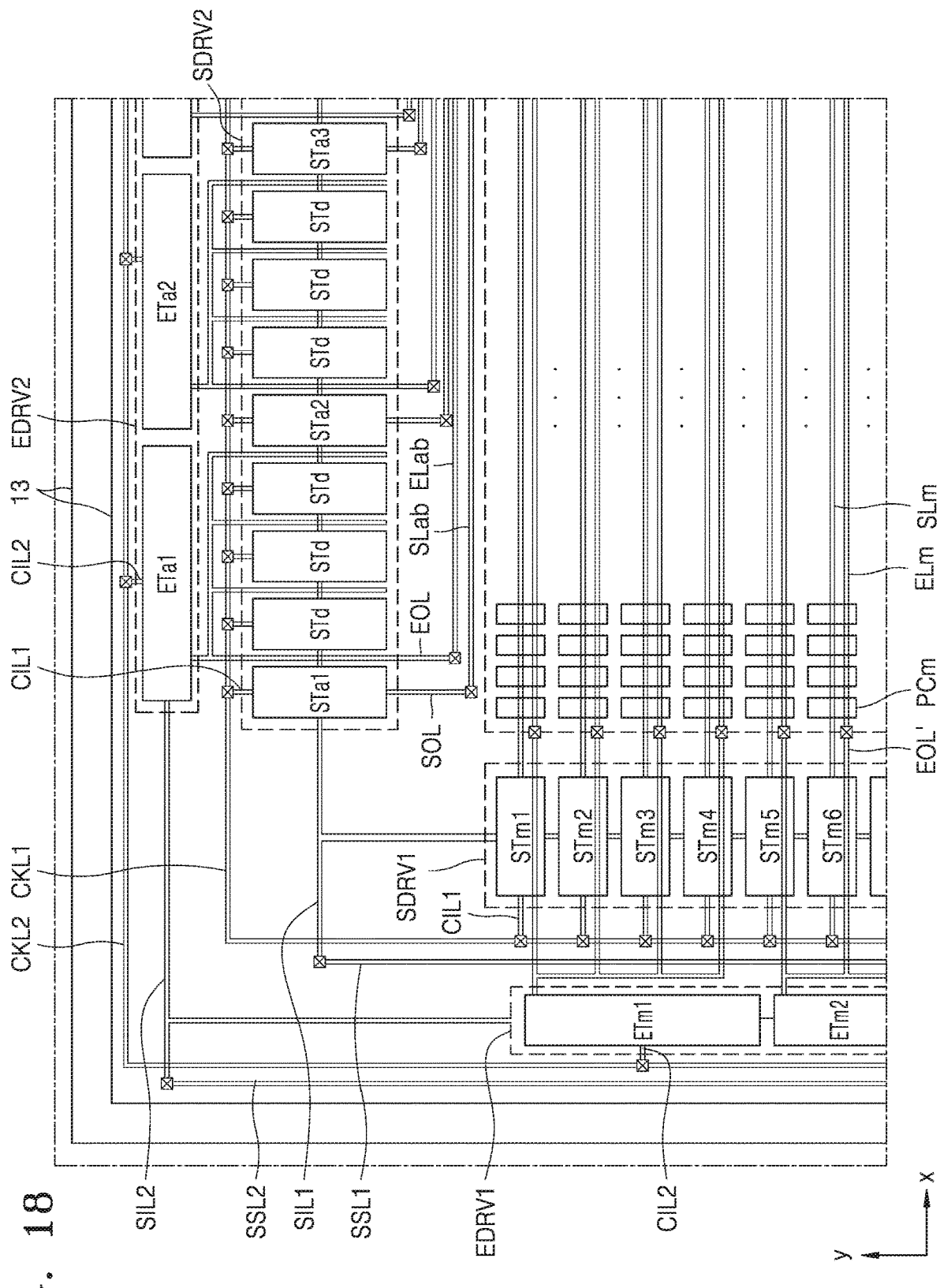
FIG. 18 is an enlarged plan view of region C of FIG. 17 according to an embodiment.
Figure 19:
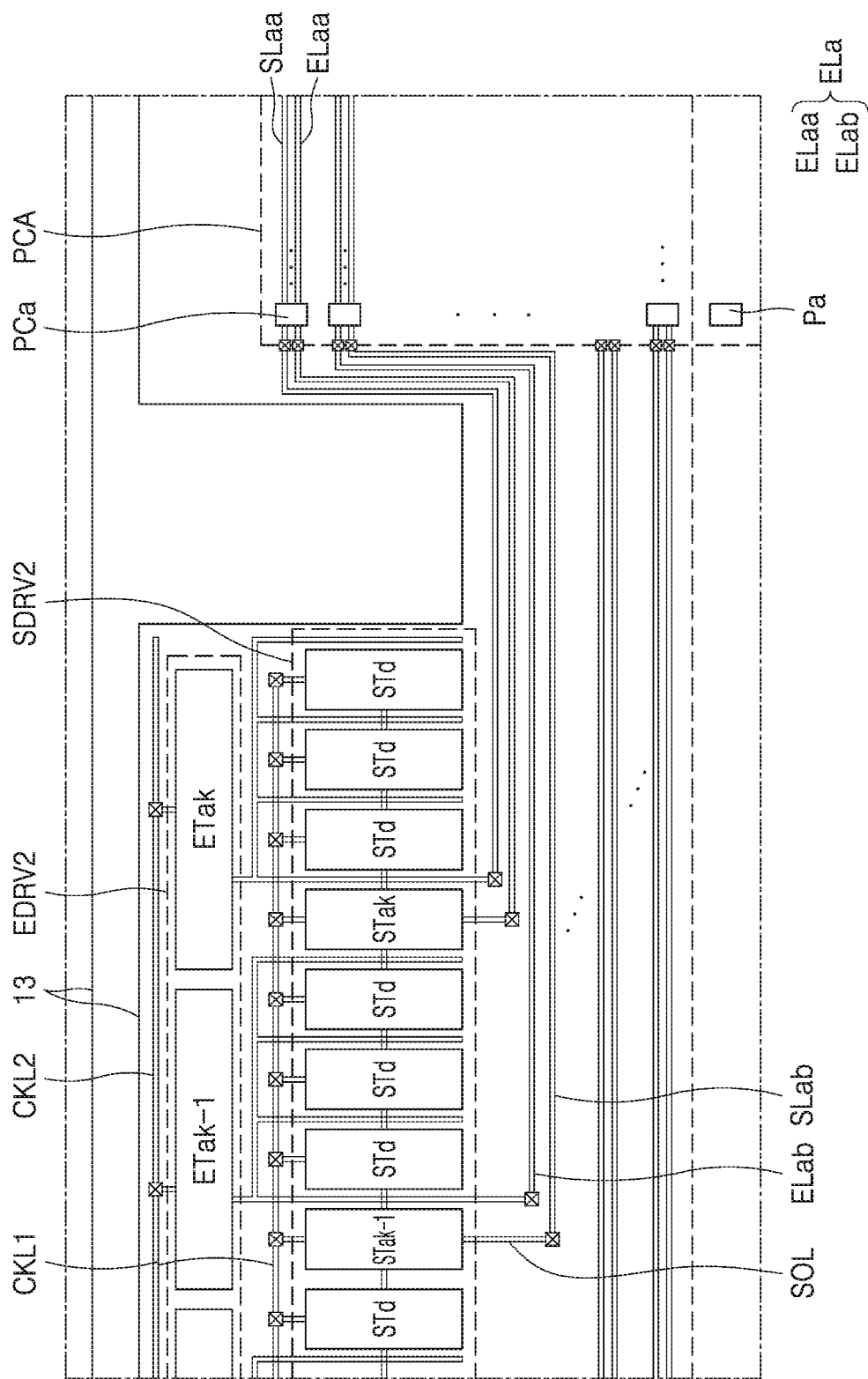
FIG. 19 is an enlarged plan view of region D of FIG. 17 according to an embodiment.

FIG. 18 is an enlarged plan view of a region C of FIG. 17 according to an embodiment. FIG. 19 is an enlarged plan view of a region D of FIG. 17 according to an embodiment. Hereinafter, configurations different from those of FIGS. 10 to 14 are mainly described.

Referring to FIGS. 18 and 19, a plurality of third stages ETm1, ETm2, . . . of the first emission control driving circuit EDRV1 may be arranged in the y-direction in the left peripheral area DPA of the substrate 100. The first emission control driving circuit EDRV1 may be arranged between the common voltage supply line 13 and the main display area MDA. The first emission control driving circuit EDRV1 may be arranged between the common voltage supply line 13 and the first scan driving circuit SDRV1. An emission control signal output by one third stage of the first emission control driving circuit EDRV1 may be applied to the first pixel circuits PCm in a plurality of rows. As an example, as shown in FIG. 18, third stages of the first emission control driving circuit EDRV1 and first stages of the first scan driving circuit SDRV1 may be arranged at a ratio of 1:4, and an emission control signal output by one third stage may be applied to the first pixel circuits PCm in four rows.

A plurality of fourth stages ETa1, ETa2, . . . , ETak of the second emission control driving circuit EDRV2 may be arranged in the x-direction in the upper left peripheral area DPA of the substrate 100. The second emission control driving circuit EDRV2 may be arranged between the common voltage supply line 13 and the main display area MDA. The second emission control driving circuit EDRV2 may be arranged between the common voltage supply line 13 and the second scan driving circuit SDRV2. An emission control signal output by one fourth stage of the second emission control driving circuit EDRV2 may be applied to the second pixel circuits PCa in a plurality of rows. As shown in FIGS. 18 and 19, fourth stages of the second emission control driving circuit EDRV2 and first stages of the second scan driving circuit SDRV2 may be arranged at a ratio of 1:1, and an emission control signal output by one fourth stage may be applied to the second pixel circuits PCm in one row.

A first start signal line SSL1 and a first clock line CKL1 may be arranged between the common voltage supply line 13 and the first scan driving circuit SDRV1. The first clock line CKL1 may be arranged between the common voltage supply line 13 and the second scan driving circuit SDRV2. A second start signal line SSL2 and a second clock line CKL2 may be arranged between the common voltage supply line 13 and the first emission control driving circuit EDRV1. The second clock line CKL2 may be arranged between the common voltage supply line 13 and the second emission control driving circuit EDRV2. Since the first start signal line SSL1, the first clock line CKL1, the first signal input line SILL and the first clock input line CIL1 are similar to the start signal line SSL, the clock line CKL, the signal input line SIL, and the clock input line CIL of FIGS. 10 and 11, detailed descriptions thereof are omitted.

The second start signal line SSL2 may extend in the y-direction along the first emission control driving circuit EDRV1. The second start signal line SSL2 may be connected to the first stage ETm1 of the first emission control driving circuit EDRV1 and the first stage ETa1 of the second emission control driving circuit EDRV2. A portion of the second signal input line SIL2 extends in the x-direction across the second clock line CKL2, branches to be connected to the first stage ETm1 of the first emission control driving circuit EDRV1 and the first stage ETa1 of the second emission control driving circuit EDRV2. The second start signal line SSL2 may be arranged on the same layer as the first start signal line SSL1.

The second clock line CKL2 may extend in the y-direction along the first emission control driving circuit EDRV1, be bent at the corner of the display panel 10, and then may extend in the x-direction along the second emission control driving circuit EDRV2. The second clock line CKL2 may be arranged on the same layer as the second start signal line SSL2. The second clock line CKL2 may be arranged on the same layer as the first clock line CKL1. The second clock line CKL2 may be connected to a plurality of stages of the first emission control driving circuit EDRV1 and a plurality of stages of the second emission control driving circuit EDRV2. The second clock line CKL2 and the second clock input line CIL2 of each of the plurality of stages may be arranged on different layers and connected through a contact hole. Though FIGS. 18 and 19 show one second clock line CKL2 as an example, two or more clock lines may be arranged depending on a circuit configuration of a stage.

The main emission control line ELm may be connected to the plurality of third stages of the first emission control driving circuit EDRV1. The main emission control line ELm may be arranged on a layer different from an output line EOL' of each of the plurality of stages of the first emission control driving circuit EDRV1 and connected through a contact hole. The auxiliary emission control line ELa may be connected to each of the plurality of fourth stages of the second emission control driving circuit EDRV2. The auxiliary emission control line ELa may be arranged on a layer different from an output line EOL of each of the plurality of stages of the second emission control driving circuit EDRV2 and connected through a contact hole. The auxiliary emission control line ELa may include a first auxiliary emission control line ELaa and a second auxiliary emission control line ELab.

First auxiliary emission control lines ELaa may extend in the x-direction in the pixel circuit area PCA, be arranged in a corresponding row, and connected to the second pixel circuits PCa. The second auxiliary emission control line ELab may connect an output line EOL of each of the stages to the first auxiliary emission control lines ELaa. The second auxiliary emission control lines ELab may be alternately arranged with the second auxiliary scan lines SLab and be apart from each other with a constant interval. In an embodiment, the second auxiliary emission control lines ELab may be arranged on a layer different from the second auxiliary scan lines SLab. In an embodiment, the second auxiliary emission control lines ELab may be spaced apart from each other on the same layer. In another embodiment, the second auxiliary emission control lines ELab may be alternately arranged on different layers. The lengths of the second auxiliary emission control lines ELab may be different from each other depending on the locations of the fourth stages of the second emission control driving circuit EDRV2 connected thereto. As an example, the length of the second auxiliary emission control lines ELab connected to a stage closer to the pixel circuit area PCA may be shorter.

In an embodiment, the output line EOL, the first auxiliary emission control lines ELaa, and the second auxiliary emission control lines ELab may be arranged on the same layer. In another embodiment, the output line EOL and the first auxiliary emission control lines ELaa may be arranged on the same layer, and the second auxiliary emission control lines ELab may be arranged on a layer different from the output line EOL and the first auxiliary emission control lines ELaa and connected to the output line EOL and the first auxiliary emission control lines ELaa through contact holes.

In an embodiment, the sizes of the output buffers of the plurality of fourth stages ETa1, ETa2, . . . , ETak of the second emission control driving circuit EDRV2 may be different from the sizes of the output buffers of the plurality of third stages ETm1, ETm2, . . . of the first emission control driving circuit EDRV1. The size of an output buffer of a stage closer to the pixel circuit area PCA may be smaller. The sizes of the output buffers of the plurality of fourth stages ETa1, ETa2, . . . , ETak may be proportional to the length of the auxiliary emission control line ELa or the length of the second auxiliary emission control line ELab.

Though not shown, as shown in FIGS. 13 and 14, some of the second auxiliary emission control lines ELab may partially include a bent portion and overlap the common voltage supply line 13.

Figure 20:
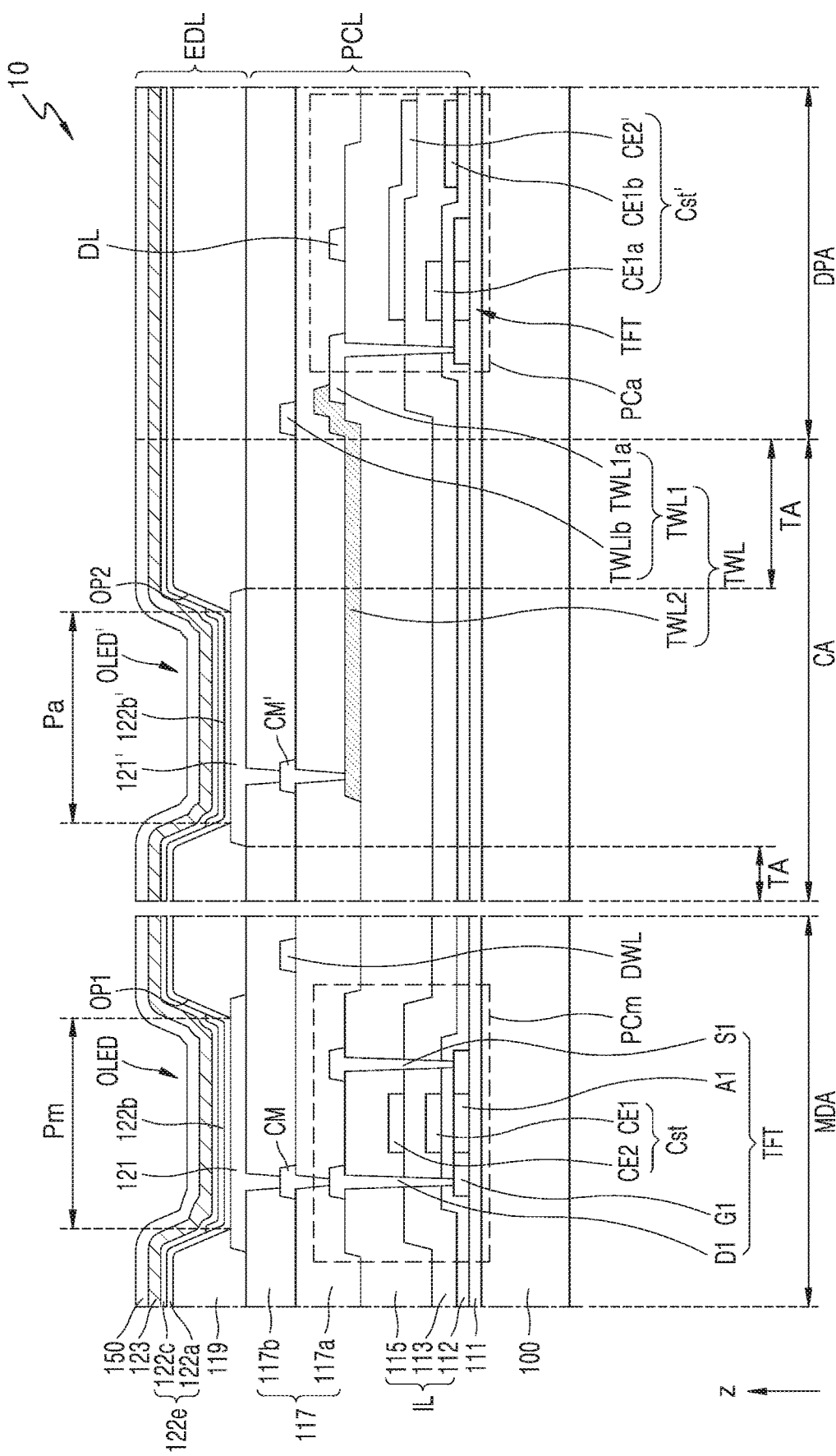
FIG. 20 is a cross-sectional view of a portion of a display panel according to an embodiment.

FIG. 20 is a cross-sectional view of a portion of a display panel according to an embodiment. Referring to FIG. 20, the first sub-pixel Pm is arranged in the main display area MDA, the second sub-pixel Pa is arranged in the component area CA, and the component area CA includes the transmission area TA. The first pixel circuit PCm and a first organic light-emitting diode OLED may be arranged in the main display area MDA. The first pixel circuit PCm includes a thin-film transistor TFT and a capacitor Cst. The first organic light-emitting diode OLED is a display element connected to the first pixel circuit PCm. A second organic light-emitting diode OLED' may be arranged in the component area CA. The second pixel circuit PCa may be arranged in the peripheral area DPA. The second pixel circuit PCa includes a thin-film transistor TFT and a capacitor Cst'. A connection line TWL may be arranged in the component area CA and the peripheral area DPA. The connection line TWL connects the second pixel circuit PCa to the second organic light-emitting diode OLED'.

Though the present embodiment describes an example in which an organic light-emitting diode is employed as a display element as an example, an inorganic light-emitting element or a quantum-dot light-emitting element may be employed as a display element in another embodiment.

Hereinafter, a structure of the display panel 10 is described. The display panel 10 may include the substrate 100, a buffer layer 111, a circuit layer PCL, and a display element layer EDL that are stacked.

The substrate 100 may include an insulating material such as glass, quartz, and a polymer resin. The substrate 100 may be a rigid substrate or a flexible substrate that is bendable, foldable, and rollable.

The buffer layer 111 may be arranged on the substrate 100 to reduce or block the penetration of foreign substances, moisture, or external air from below the substrate 100 and may provide a flat surface on the substrate 100. The buffer layer 111 may include an inorganic material such as oxide or nitride, or an organic material, or an organic/inorganic composite material and include a single-layered or multi-layered structure of an inorganic material and an organic material. A barrier layer (not shown) may be arranged between the substrate 100 and the buffer layer 111, the barrier layer blocking the penetration of external air. In an embodiment, the buffer layer 111 may include silicon oxide ($SiO_2$) or silicon nitride ($SiN_x$).

The circuit layer PCL may be arranged on the buffer layer 111 and may include the pixel circuits, that is, the first pixel circuit PCm and the second pixel circuit PCa, a first gate insulating layer 112, a second gate insulating layer 113, an interlayer insulating layer 115, and a planarization layer 117.

The thin-film transistor TFT may be arranged on the buffer layer 111. The thin-film transistor TFT includes a semiconductor layer A1, a gate electrode G1, a source electrode S1, and a drain electrode D1. The thin-film transistor TFT of the first pixel circuit PCm may be connected to the first organic light-emitting diode OLED to drive the first organic light-emitting diode OLED. The thin-film transistor TFT of the second pixel circuit PCa may be connected to the second organic light-emitting diode OLED' to drive the second organic light-emitting diode OLED'.

The semiconductor layer A1 may be arranged on the buffer layer 111 and may include polycrystalline silicon. In another embodiment, the semiconductor layer A1 may include amorphous silicon. In another embodiment, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, a source region, and a drain region. The source region and the drain region may be doped with impurities.

The first gate insulating layer 112 may cover the semiconductor layer A1. The first gate insulating layer 112 may include an inorganic insulating material including silicon oxide ($SiO_2$), silicon nitride ($SiN_x$), silicon oxynitride ($Si O_x N_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multi-layer including the above inorganic insulating materials.

The gate electrode G1 is arranged on the first gate insulating layer 112 to overlap the semiconductor layer A1. The gate electrode G1 may include at least one molybdenum (Mo), aluminum (Al), copper (Cu), and titanium (Ti) and include a single layer or a multi-layer. As an example, the gate electrode G1 may include a single Mo layer.

The second gate insulating layer 113 may cover the gate electrode G1. The second gate insulating layer 113 may include an inorganic insulating material including silicon oxide ($SiO_2$), silicon nitride ($SiN_x$), silicon oxynitride ($Si O_x N_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multi-layer including the above inorganic insulating materials.

Top electrodes CE2 and CE2' of capacitors Cst and Cst' may be arranged on the second gate insulating layer 113. The top electrodes CE2 and CE2' of the capacitors Cst and Cst' may overlap the gate electrode G1 in a plan view. The gate electrode G1 and the top electrodes CE2 and CE2' overlapping each other with the second gate insulating layer 113 disposed therebetween may constitute the capacitors Cst and Cst'. The gate electrode G1 may serve as bottom electrodes CE1 and CE1a of the capacitors Cst and Cst'.

In the peripheral area DPA, the capacitor Cst' may further include a bottom electrode CE1b arranged on the same layer as the bottom electrode CE1a. The top electrode CE2' of the capacitor Cst' may overlap the bottom electrodes CE1a and CE1b in a plan view. The bottom electrodes CE1a and CE1b may be electrically connected to each other. With this configuration, a capacitance of the capacitor Cst' of the second pixel circuit PCa may be greater than a capacitance of the capacitor Cst of the first pixel circuit PCm.

The top electrodes CE2 and CE2' may include a single layer or a multi-layer including aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu).

The interlayer insulating layer 115 may cover the top electrodes CE2 and CE2'. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or a multi-layer including the above inorganic insulating materials.

The source electrode S1 and the drain electrode D1 may be arranged on the interlayer insulating layer 115. The source electrode S1 and the drain electrode D1 may include a conductive material including molybdenum (Mo), aluminum (Al), copper (Cu), and titanium (Ti) and include a single layer or a multi-layer including the above materials. As an example, the source electrode S1 and the drain electrode D1 may have a multi-layered structure of Ti/Al/Ti.

The connection line TWL may be arranged on the interlayer insulating layer 115, the connection line TWL being connected to the second pixel circuit PCa. The connection line TWL may extend from the peripheral area DPA to the component area CA to connect the second organic light-emitting diode OLED' to the second pixel circuit PCa. In addition, the data line DL may be arranged on the interlayer insulating layer 115.

The connection line TWL may include a first connection line TWL1 and a second connection line TWL2. The first connection line TWL1 may be arranged in the peripheral area DPA and connected to the thin-film transistor TFT of the second pixel circuit PCa. The second connection line TWL2 may be connected to the first connection line TWL1 and arranged in the transmission area TA of the component area CA. The second connection line TWL2 may include a material different from the first connection line TWL1. The end of the second connection line TWL2 may cover the end of the first connection line TWL1.

The first connection line TWL1 may include a conductive material including molybdenum (Mo), aluminum (Al), copper (Cu), and titanium (Ti) and include a single layer or a multi-layer including the above materials. The first connection line TWL1 may include a (1-1)st connection line TWL1a and a (1-2)nd connection line TWL1b each arranged on different layers. In an embodiment, the (1-1)st connection line TWL1a may be arranged on the same layer as the data line DL and may include the same material as the data line DL. The (1-2)nd connection line TWL1b and the (1-1)st connection line TWL1a may be arranged with a first planarization layer 117a interposed therebetween. The (1-2)nd connection line TWL1b may be arranged on the first planarization layer 117a which is the same layer as connection metals CM and CM'. In another embodiment, the (1-2)nd connection line TWL1b may be arranged on the same layer as the top electrode CE2' or the bottom electrodes CE1a and CE1b of the capacitor Cst'.

The planarization layer 117 may be arranged to cover source electrodes S1 and S2, drain electrodes D1 and D2, and the connection line TWL. The planarization layer 117 may have a flat top surface such that a first pixel electrode 121 and a second pixel electrode 121' disposed thereon are formed flat.

The planarization layer 117 may include an organic material or an inorganic material and include a single-layered or multi-layered structure. The planarization layer 117 may include a first planarization layer 117a and a second planarization layer 117b. Accordingly, since conductive patterns such as a wiring, etc. may be formed between the first planarization layer 117a and the second planarization layer 117b, it is advantageous in high density integration. The connection metals CM and CM' and the data connection line DWL may be arranged on the first planarization layer 117a.

The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. The planarization layer 117 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). When forming the planarization layer 117, chemical mechanical polishing may be performed on the top surface of the planarization layer 117 to provide a flat top surface after forming the planarization layer 117.

The first planarization layer 117a may cover the first and second pixel circuits PCm and PCa. The second planarization layer 117b may be arranged on the first planarization layer 117a and may have a flat top surface.

The first and second organic light-emitting diodes OLED and OLED' may be arranged on the second planarization layer 117b. The first and second pixel electrodes 121 and 121' of the first and second organic light-emitting diodes OLED and OLED' may be respectively connected to the first and second pixel circuits PCm and PCa through the connection metals CM and CM' arranged on the first planarization layer 117a.

The first and second pixel electrodes 121 and 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first and second pixel electrodes 121 and 121' may include a reflective layer including silver (Ag), magnesium (Mg), aluminum (Al), platinum (Pt), palladium (Pd), gold (Au), nickel (Ni), neodymium (Nd), iridium (Jr), chrome (Cr), or a compound thereof. As an example, the first and second pixel electrodes 121 and 121' may have a structure having layers including ITO, IZO, ZnO or $In_2O_3$ on/under the reflective layer. In this case, the first and second pixel electrodes 121 and 121' may have a stack structure of ITO/Ag/ITO.

A pixel-defining layer 119 may cover the edges of the first and second pixel electrodes 121 and 121' on the planarization layer 117 and include a first opening OP1 and a second opening OP2 respectively exposing portions of the first and second pixel electrodes 121 and 121'. Emission areas, that is, the sizes and shapes of the first and second sub-pixels Pm and Pa of the first and second organic light-emitting diodes OLED and OLED' are defined by the first opening OP1 and the second opening OP2.

The pixel-defining layer 119 may be formed through spin coating, etc. by using an organic insulating material such as polyimide, polyamide, an acrylic resin, HMDSO, and a phenolic resin.

A first emission layer 122b and a second emission layer 122b' are arranged inside the first opening OP1 and the second opening OP2 of the pixel-defining layer 119, the first emission layer 122b and the second emission layer 122b' respectively corresponding to the first and second pixel electrodes 121 and 121'. The first emission layer 122b and the second emission layer 122b' may include a polymer material or a low molecular weight material and emit red, green, blue, or white light.

An organic functional layer 122e may be arranged on and/or under the first emission layer 122b and the second emission layer 122b'. The organic functional layer 122e may include a first functional layer 122a and/or a second functional layer 122c. The first functional layer 122a and/or the second functional layer 122c may be omitted.

The first functional layer 122a may be arranged under the first emission layer 122b and the second emission layer 122b'. The first functional layer 122a may include a single layer or a multi-layer including an organic material. The first functional layer 122a may be a hole transport layer (HTL), which has a single-layered structure. Alternatively, the first functional layer 122a may include a hole injection layer (HIL) and a hole transport layer (HTL). The first functional layer 122a may be formed as one body to correspond to the first and second organic light-emitting diodes OLED and OLED' included in the main display area MDA and the component area CA.

The second functional layer 122c may be arranged on the first emission layer 122b and the second emission layer 122b'. The second functional layer 122c may have a single layer or a multi-layer including an organic material. The second functional layer 122c may include an electron transport layer (ETL) and/or an electron injection layer (EIL). The second functional layer 122c may be formed as one body to correspond to the first and second organic light-emitting diodes OLED and OLED' included in the main display area MDA and the component area CA.

An opposite electrode 123 is arranged on the second functional layer 122c. The opposite electrode 123 may include a conductive material having a low work function. As an example, the opposite electrode 123 may include a (semi) transparent layer including silver (Ag), magnesium (Mg), aluminum (Al), platinum (Pt), palladium (Pd), gold (Au), nickel (Ni), neodymium (Nd), iridium (Jr), chrome (Cr), lithium (Li), calcium (Ca), or an alloy thereof. Alternatively, the opposite electrode 123 may further include a layer including ITO, IZO, ZnO, or $In_2O_3$ on/under the (semi) transparent layer including the above material. The opposite electrode 123 may be formed as one body to correspond to the first and second organic light-emitting diodes OLED and OLED' included in the main display area MDA and the component area CA.

Layers ranging from the first pixel electrode 121 to the opposite electrode 123 in the main display area MDA may constitute the first organic light-emitting diode OLED. Layers ranging from the second pixel electrode 121' to the opposite electrode 123 in the component area CA may constitute the second organic light-emitting diode OLED'.

A top layer 150 may be formed on the opposite electrode 123, the top layer 150 including an organic material. The top layer 150 may be a layer prepared to protect the opposite electrode 123 and simultaneously increase light extraction efficiency. The top layer 150 may include an organic material having a higher refractive index than the opposite electrode 123. Alternatively, the top layer 150 may include layers that have different refractive indexes and are stacked. As an example, the top layer 150 may include a high refractive index layer/a low refractive index layer/a high refractive index layer that are stacked. In this case, the refractive index of the high refractive index layer may be 1.7 or more, and the refractive index of the low refractive index layer may be 1.3 or less.

The top layer 150 may additionally include lithium fluoride (LiF). Alternatively, the top layer 150 may additionally include an inorganic insulating material including silicon oxide ($SiO_2$) and silicon nitride ($SiN_x$).

As described above, in the display apparatus according to the present embodiments, the pixel circuit is not arranged in the component area, a wider transmission area may be secured, and thus, a transmittance may be improved. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus including a display area including a component area, the display apparatus comprising:
    a data line extending in a first direction;
    a first pixel circuit disposed outside the component area and connected to the data line;
    a second pixel circuit disposed outside the component area and electrically connected to the data line;
    a first pixel electrode disposed outside the component area and electrically connected to the first pixel circuit;
    a second pixel electrode disposed in the component area and electrically connected to the second pixel circuit; and
    a light blocking layer disposed in a layer below the second pixel circuit to overlap with the second pixel electrode and not to overlap with the first pixel electrode and the second pixel circuit in a plan view.

2. The display apparatus of claim 1, further comprising a transparent conductive line connecting the second pixel electrode and the second pixel circuit,
    wherein the transparent conductive line is disposed in a layer over a thin-film transistor included the second pixel circuit.

3. The display apparatus of claim 2, wherein the transparent conductive line extends in the first direction.

4. The display apparatus of claim 2, wherein the transparent conductive line includes a first connection line disposed outside the component area and a second connection line disposed in the component area and connected to the first connection line.

5. The display apparatus of claim 4, wherein a conductivity of the first connection line is higher than a conductivity of the second connection line.

6. The display apparatus of claim 4, wherein a light transmittance of the first connection line is lower than a light transmittance of the second connection line.

7. The display apparatus of claim 1, wherein the light blocking layer comprises a metal.

8. The display apparatus of claim 1, further comprising:
    an auxiliary data line connected to the second pixel circuit; and
    a data connection line electrically connecting the data line to the auxiliary data line.

9. The display apparatus of claim 1, wherein the component area includes a transmission area and the light blocking layer includes a hole corresponding to the transmission area.

10. The display apparatus of claim 1, further comprising a component arranged in the component area,
wherein the component includes a camera.

11. The display apparatus of claim 1, further comprising:
a first scan line disposed outside the component area, extending in a second direction perpendicular to the first direction and connected to the first pixel circuit; and
a second scan line disposed outside the component area, extending in the second direction and connected to the second pixel circuit.

12. The display apparatus of claim 11, further comprising:
a first scan driving circuit arranged in a peripheral area outside the display area and configured to output a first scan signal to the first pixel circuit through the first scan line; and
a second scan driving circuit arranged in the peripheral area and configured to output a second scan signal to the second pixel circuit through the second scan line.

13. The display apparatus of claim 12, wherein an output interval of the second scan signal is greater than an output interval of the first scan signal.

14. The display apparatus of claim 12, wherein the second pixel circuit is disposed in the peripheral area.

15. A display apparatus comprising:
a substrate including a display area which includes a main display area and a component area;
a first pixel electrode disposed in the main display area;
a second pixel electrode disposed in the component area; and
a light blocking layer disposed in the component area between the second pixel electrode and the substrate to overlap with the second pixel electrode and not to overlap with the first pixel electrode and a pixel circuit connected to the second pixel electrode in a plan view.

16. The display apparatus of claim 15, wherein the second pixel electrode is completely overlapped with the light blocking layer in a plan view.

17. The display apparatus of claim 16, wherein the substrate further includes a peripheral area which surrounds the main display area and the component area, and
wherein the pixel circuit is disposed in the peripheral area.

18. The display apparatus of claim 17, wherein the pixel circuit is connected to the second pixel electrode through a connection line.

19. The display apparatus of claim 18, wherein the connection line includes a first connection line disposed in the peripheral area and a second connection line connected to the first connection line in the peripheral area, and
wherein a conductivity of the first connection line is higher than a conductivity of the second connection line.

* * * * *